(12) United States Patent
Tanimoto et al.

(10) Patent No.: US 8,836,089 B2
(45) Date of Patent: Sep. 16, 2014

(54) POSITIVE PHOTOSENSITIVE RESIN COMPOSITION, METHOD OF CREATING RESIST PATTERN, AND ELECTRONIC COMPONENT

(75) Inventors: Akitoshi Tanimoto, Hitachi (JP); Shigeru Nobe, Hitachi (JP); Kei Kasuya, Hitachi (JP); Hiroshi Matsutani, Hitachi (JP); Takumi Ueno, Hitachi (JP); Yu Aoki, Hitachi (JP); Shingo Tahara, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/823,260

(22) PCT Filed: Sep. 2, 2011

(86) PCT No.: PCT/JP2011/070055
§ 371 (c)(1),
(2), (4) Date: Mar. 14, 2013

(87) PCT Pub. No.: WO2012/036000
PCT Pub. Date: Mar. 22, 2012

(65) Prior Publication Data
US 2013/0168859 A1      Jul. 4, 2013

(30) Foreign Application Priority Data
Sep. 16, 2010    (JP) ................. P2010-208061

(51) Int. Cl.
*H01L 23/29*    (2006.01)
*H01L 21/47*    (2006.01)
*G03F 7/075*    (2006.01)
*G03F 7/039*    (2006.01)
*G03F 7/40*     (2006.01)
*G03F 7/022*    (2006.01)

(52) U.S. Cl.
CPC .............. *G03F 7/039* (2013.01); *G03F 7/0751* (2013.01); *G03F 7/40* (2013.01); *G03F 7/0226* (2013.01)
USPC ........................................ 257/642; 430/270.1

(58) Field of Classification Search
CPC .................................................... G03F 7/0751
See application file for complete search history.

(56) References Cited

U.S. PATENT DOCUMENTS

| | | | |
|---|---|---|---|
| 8,426,985 B2* | 4/2013 | Matsutani et al. ............. | 257/786 |
| 8,461,699 B2* | 6/2013 | Matsutani et al. ............. | 257/788 |
| 2011/0250396 A1* | 10/2011 | Matsutani et al. ............. | 428/156 |

FOREIGN PATENT DOCUMENTS

| CN | 1716094 | 1/2006 |
|---|---|---|
| JP | 2003-215802 | 7/2003 |

(Continued)

OTHER PUBLICATIONS

Renesas Electronics Corporation, "Semiconductor Reliability Handbook Rev. 050", Sep. 20, 2010, 8 pp.
Taiwanese Official Action dated Sep. 24, 2013, for TW Application No. 100132431.

(Continued)

*Primary Examiner* — Stephen W Smoot
(74) *Attorney, Agent, or Firm* — Antonelli, Terry, Stout & Kraus, LLP.

(57) ABSTRACT

The positive-type photosensitive resin composition according to the present invention comprises an alkali-soluble resin having a phenolic hydroxyl group, a compound that produces an acid by light, a thermal crosslinking agent, and a silane compound having at least one functional group selected from an epoxy group and a sulfide group.

22 Claims, 7 Drawing Sheets

(56) References Cited

FOREIGN PATENT DOCUMENTS

| JP | 2008-276190 | 11/2008 |
|----|-------------|---------|
| JP | 2009-230124 | 10/2009 |
| JP | 2009-244663 | 10/2009 |
| WO | WO 2008/123049 | 10/2008 |
| WO | WO 2010/073948 | 7/2010 |

OTHER PUBLICATIONS

Translation of the International Preliminary Report on Patentability dated Apr. 18, 2013, for International (PCT) Application No. PCT/JP2011/070055.
Chinese Official Action dated Jun. 18, 2014, for CN Application No. 201180044326.9.

* cited by examiner

POSITIVE PHOTOSENSITIVE RESIN COMPOSITION, METHOD OF CREATING RESIST PATTERN, AND ELECTRONIC COMPONENT

TECHNICAL FIELD

The present invention relates to a positive-type photosensitive resin composition, a method for production of a resist pattern, and an electronic component.

BACKGROUND ART

In recent years, higher integration of a semiconductor element and reduction in size have progressed, and there has been a demand for a thinner and miniaturized encapsulating resin package. Accompanied by this demand, a surface protective layer and an interlayer insulation film of the semiconductor element and a photosensitive resin composition for a redistribution layer are needed to be formed of a material having more excellent electrical properties, thermal resistance, mechanical properties, and the like. As a material having such properties, a photosensitive resin composition containing an alkali-soluble resin having a phenolic hydroxyl group has been developed (for example, see Patent Literature 1). Such a photosensitive resin composition is advantageous in that heating and curing at a low temperature are enabled in a step of heating and curing a resist pattern formed by performing exposure and development.

CITATION LIST

Patent Literature

Patent Document 1: Japanese Patent Application Laid-Open No. 2003-215802

Non Patent Literature

Non-Patent Document 1: Shinraisei Handbook, edited by Renesas Electronics Corporation (2010, Rev. 0.50)

SUMMARY OF INVENTION

Technical Problem

Along with higher integration of a semiconductor element, reduction in size, and finer patterning, it has been demanded that a photosensitive resin composition for a surface protective layer, an interlayer insulation film, and a redistribution layer of the semiconductor element have high sensitivity and resolution, and formation of a finer and more precise resist pattern is possible.

Further, along with higher integration of a semiconductor element and reduction in size, the surface area of a metal wiring of gold, copper, Ni, or the like, for example, is increased with respect to the surface area of the semiconductor element. Accordingly, the photosensitive resin composition for a surface protective layer, an interlayer insulation film, and a redistribution layer of the semiconductor element needs to have high adhesiveness to the above metal wiring. In the case where the adhesiveness between the photosensitive resin composition and the metal wiring is bad, it is known that peel occurs between the photosensitive resin composition and the metal wiring, and disconnection derived from the peel or a package crack occurs (for example, see Non Patent Literature 1). The photosensitive resin composition containing an alkali-soluble resin having a phenolic hydroxyl group so far is excellent in mechanical properties, but further improvement has been demanded in respect of sensitivity, resolution, and adhesiveness.

Then, an object of the present invention is to provide a positive-type photosensitive resin composition that has sensitivity, resolution, and adhesiveness to a metal substrate higher than those of the conventional material, can form a resist pattern having high mechanical properties (elongation at break and elastic modulus), and can be developed with an alkali aqueous solution. Moreover, another object of the present invention is to provide a method of producing a resist pattern having high properties described above and an electronic component including the resist pattern.

Solution to Problem

The present invention relates to:

[1] A positive-type photosensitive resin composition, comprising:
an alkali-soluble resin having a phenolic hydroxyl group,
a compound that produces an acid by light,
a thermal crosslinking agent, and
a silane compound having at least one functional group selected from an epoxy group and a sulfide group.

[2] The positive-type photosensitive resin composition according to [1], wherein as the silane compound, the positive-type photosensitive resin contains a compound having a structure represented by the following formula (1):

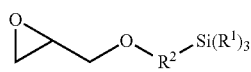

wherein $R^1$ represents a monovalent organic group, and $R^2$ group represents a divalent organic group.

[3] The positive-type photosensitive resin composition according to [1] or [2], wherein as the silane compound, the positive-type photosensitive resin composition contains a compound having a structure represented by the following formula (2):

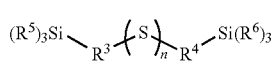

wherein $R^3$ and $R^4$ each independently represent a divalent organic group, $R^5$ and $R^6$ each independently represent a monovalent organic group, and n represents an integer of 1 to 6.

[4] The positive-type photosensitive resin composition according to any one of [1] to [3], wherein as the alkali-soluble resin, the positive-type photosensitive resin composition contains phenol resin.

[5] The positive-type photosensitive resin composition according to any one of [1] to [4], wherein as the alkali-soluble resin, the positive-type photosensitive resin composition contains a first phenol resin that is a phenol resin having no phenolic hydroxyl group modified with an unsaturated hydrocarbon group-containing compound, and a second phenol resin that is a modified phenol resin having a phenolic hydroxyl group modified with an unsaturated hydrocarbon group-containing compound.

[6] The positive-type photosensitive resin composition according to [5], wherein the second phenol resin further has a phenolic hydroxyl group modified with a polybasic acid anhydride.

[7] The positive-type photosensitive resin composition according to [5] or [6], wherein a content of the first phenol resin is 5 to 95% by mass based on a total of the content of the first phenol resin and a content of the second phenol resin.

[8] The positive-type photosensitive resin composition according to any one of [1] to [7], wherein the compound that produces an acid by light is an o-quinone diazide compound.

[9] The positive-type photosensitive resin composition according to any one of [1] to [8], wherein a content of the compound that produces an acid by light is 3 to 100 parts by mass based on 100 parts by mass of a content of the alkali-soluble resin.

[10] The positive-type photosensitive resin composition according to any one of [1] to [9], further comprising an acrylic resin.

[11] The positive-type photosensitive resin composition according to any one of [1] to [10], further comprising a compound that produces an acid by heat.

[12] The positive-type photosensitive resin composition according to any one of [1] to [11], further comprising an elastomer.

[13] A method of producing a resist pattern, comprising:
a first step of applying the positive-type photosensitive resin composition according to any one of [1] to [12] onto a support substrate, and drying the applied positive-type photosensitive resin composition to form a photosensitive resin film,
a second step of exposing the photosensitive resin film,
a third step of developing the photosensitive resin film after exposure with an alkali aqueous solution to form a resist pattern, and
a fourth step of heating the resist pattern.

[14] The method of producing a resist pattern according to [13], wherein the fourth step is a step of heating the resist pattern at a temperature of not more than 200° C.

[15] An electronic component having a resist pattern created by the method of producing a resist pattern according to [13] or [14] as an interlayer insulating layer or a surface protective film.

[16] An electronic component having a resist pattern created by the method of producing a resist pattern according to [13] or [14] as a cover coat layer.

[17] An electronic component having a resist pattern created by the method of producing a resist pattern according to [13] or [14] as a core for redistribution.

[18] An electronic component having a resist pattern created by the method of producing a resist pattern according to [13] or [14] as a collar for holding a conductive ball, which is an external connection terminal.

[19] An electronic component having a resist pattern created by the method of producing a resist pattern according to [13] or [14] as an underfill.

Advantageous Effects of Invention

The positive-type photosensitive resin composition according to the present invention can form a resist pattern having high adhesion to a metal wiring, good sensitivity and resolution, and high thermal shock resistance by development using an alkali aqueous solution.

Further, according to the positive-type photosensitive resin composition according to the present invention, a resist pattern whose mechanical properties are excellent can be formed by heating at a low temperature; therefore, damage of semiconductor apparatuses and electronic devices including these semiconductor apparatuses by heat can be prevented, and highly reliable electronic components (semiconductor apparatuses and electronic devices) can be provided with a high yield.

Moreover, according to the method of producing a resist pattern according to the present invention, the resist pattern having high properties as above can be produced effectively. Moreover, the electronic component according to the present invention is very useful from the viewpoint of reliability and yield because the electronic component includes the resist pattern having high properties as above.

DESCRIPTION OF EMBODIMENT

Figure 1:
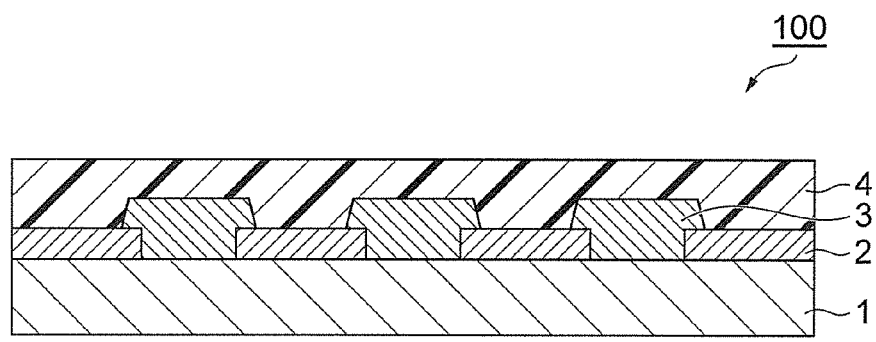
FIG. 1 is a schematic sectional view showing one embodiment of a step of producing a semiconductor apparatus.

Hereinafter, "(meth)acrylate" herein collectively means "acrylate" and "methacrylate" corresponding thereto. Similarly, "(meth)acrylic" collectively means "acrylic" and "methacryl" corresponding thereto.

[First Embodiment: Positive-type Photosensitive Resin Composition]

The positive-type photosensitive resin composition according to First Embodiment of the present invention contains an (A) alkali-soluble resin having a phenolic hydroxyl group, a (B) compound that produces an acid by light, a (C) thermal crosslinking agent, and a (D) silane compound having at least one functional group selected from an epoxy group and a sulfide group.

<(A) Component: Alkali-soluble Resin Having a Phenolic Hydroxyl Group>

The (A) component is an alkali-soluble resin having a phenolic hydroxyl group in the molecule. The "alkali-soluble resin" means a resin soluble in an alkali developer.

Here, one criterion that the (A) component is alkali soluble will be described below. A varnish obtained by dissolving the (A) component alone or the respective components (A), (B), (C), (D), and the like to be described below in order in the (H) solvent is applied onto a substrate such as a silicon wafer by spin coating to form a coating film having a film thickness of 5 μm. The coating film is immersed in one of a tetramethylammonium hydroxide aqueous solution, a metal hydroxide aqueous solution, and an organic amine aqueous solution at 20 to 25° C. As a result, when the (A) component can be dissolved as a uniform solution, the (A) component used is alkali soluble.

Examples of the alkali-soluble resin having a phenolic hydroxyl group in the (A) component include hydroxystyrene based resins such as copolymers containing polyhydroxystyrene and hydroxystyrene as monomer units, phenol resins, polybenzoxazole precursors such as poly(hydroxyamide), poly(hydroxyphenylene)ether, and polynaphthol.

Among these, phenol resins are preferable, and novolak type phenol resins are more preferable because these resins are inexpensive and volume shrinkage during curing is small. Moreover, because electrical properties (insulation) are high and volume shrinkage during curing is small, vinyl polymers containing monomer units having a phenolic hydroxyl group, and particularly (poly)hydroxystyrene based resins are also preferable.

The phenol resin is a polycondensation product of phenol or a derivative thereof and aldehydes. Polycondensation is performed in the presence of a catalyst such as an acid or a base. The phenol resin obtained in the case of using an acid catalyst is referred to as the novolak type phenol resin. Specific examples of the novolak type phenol resin include phenol/formaldehyde novolak resins, cresol/formaldehyde novolak resins, xylenol/formaldehyde novolak resins, resorcinol/formaldehyde novolak resins, and phenol-naphthol/formaldehyde novolak resins.

Examples of the phenol derivative used to obtain the phenol resin include phenol, alkylphenols such as o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,6-xylenol, 3,4-xylenol, 3,5-xylenol, 2,3,5-trimethylphenol, and 3,4,5-trimethylphenol, alkoxyphenols such as methoxyphenol and 2-methoxy-4-methyl phenol, alkenylphenols such as vinylphenol and allylphenol, aralkylphenols such as benzylphenol, alkoxy carbonyl phenols such as methoxycarbonylphenol, arylcarbonylphenols such as benzoyloxyphenol, halogenated phenols such as chlorophenol, polyhydroxybenzenes such as catechol, resorcinol, and pyrogallol, bisphenols such as bisphenol A and bisphenol F; naphthol derivatives such as α- or β-naphthol; hydroxyalkylphenols such as p-hydroxyphenyl-2-ethanol, p-hydroxyphenyl-3-propanol, and p-hydroxyphenyl-4-butanol; hydroxyalkylcresols such as hydroxyethylcresol; monoethylene oxide adducts of bisphenol; alcoholic hydroxyl group containing phenol derivatives such as monopropylene oxide adducts of bisphenol; and carboxyl group containing phenol derivatives such as p-hydroxyphenylacetic acid and p-hydroxyphenylpropionic acid p-hydroxyphenyl butanoic acid, p-hydroxycinnamic acid, hydroxybenzoic acid, hydroxyphenylbenzoic acid, hydroxyphenoxybenzoic acid, and diphenolic acid. Moreover, methylolated products of the above-mentioned phenol derivatives such as bishydroxymethyl-p-cresol may be used as the phenol derivative.

Further, the phenol resin may be a product obtained by polycondensing the phenol or a phenol derivative with aldehydes and a compound other than phenol such as m-xylene. In this case, it is preferable that the molar ratio of the compound other than phenol to the phenol derivative to be used for polycondensation be less than 0.5. One of these phenol derivatives and compounds other than the phenol compound is used alone, or not less than two are used in combination.

Examples of the aldehydes used to obtain the phenol resin include formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloroacetaldehyde, chlorophenylacetaldehyde, acetone, and glyceraldehyde. Examples of aldehydes include glyoxylic acid, methyl glyoxylate, phenyl glyoxylate, hydroxyphenyl glyoxylate, formylacetic acid, methyl formylacetate, 2-formylpropionic acid, methyl 2-formylpropionate, pyruvic acid, levulinic acid, 4-acetylbutyric acid, acetonedicarboxylic acid, and 3,3'-4,4'-benzophenonetetracarboxylic acid. Moreover, a precursor of formaldehyde such as para-formaldehyde and trioxane may be used for a reaction. One of these is used alone, or not less than two are used in combination.

As the poly(hydroxystyrene) based resin, for example, those obtained by polymerizing (vinyl polymerizing) ethylenic unsaturated double bond of hydroxystyrene, to which a protecting group is introduced, in the presence of a catalyst (radical initiator), and further performing deprotection can be used. Moreover, branched poly(hydroxystyrene) such as PHS-B (E. I. du Pont de Nemours and Company, trade name) can also be used.

Here, as the protecting group for hydroxystyrene, known protecting groups such as an alkyl group and a silyl group can be used. Moreover, a vinyl group-containing monomer such as styrene, (meth)acrylic acid, and (meth)acrylic acid ester can be copolymerized with hydroxystyrene to which a protecting group is introduced.

Considering solubility in the alkali aqueous solution and a balance between photosensitive properties and physical properties of a cured film, it is preferable that the weight average molecular weight of the (A) component be 500 to 150,000, and it is more preferable that the weight average molecular weight of the (A) component be 500 to 100,000, and it is still more preferable that the weight average molecular weight of the (A) component be 1000 to 50,000. Here, the weight average molecular weight is a value obtained by measurement by gel permeation chromatography and conversion using a standard polystyrene calibration curve.

It is preferable that the (A) component contain both of a first phenol resin that is a phenol resin having no phenolic hydroxyl group modified with an unsaturated hydrocarbon group-containing compound (hereinafter, referred to as a "phenol resin (A1)" or "(A1) component" in some cases) and a second phenol resin that is a modified phenol resin having a phenolic hydroxyl group modified with an unsaturated hydrocarbon group-containing compound (hereinafter, referred to as a "modified phenol resin (A2)" or "(A2) component" in some cases). Moreover, it is more preferable that the (A2) component further have a phenolic hydroxyl group modified with a polybasic acid anhydride. Moreover, from the viewpoint of sensitivity and resolution when the resist pattern is formed, adhesion of the resist pattern after curing, mechanical properties, and thermal shock resistance, it is preferable that the mass ratio of the (A1) component to the (A2) component be 5:95 to 95:5, it is more preferable that the mass ratio be 10:90 to 90:10, and it is particularly preferable that the mass ratio be 15:85 to 85:15 wherein the total amount is 100 and (A1) component:(A2) component (the former:the latter). In other words, it is preferable that the content of the (A1) component be 5 to 95% by mass based on the total of the content of the (A1) component and the content of the (A2) component, it is more preferable that the content of the (A1) component be 10 to 90% by mass based on the total of the content of the (A1) component and the content of the (A2) component, it is particularly preferable that the content of the (A1) component be 15 to 85% by mass based on the total of the content of the (A1) component and the content of the (A2) component.

Usually, the (A2) component can be obtained as a polycondensation product of a reaction product of phenol or a derivative thereof and an unsaturated hydrocarbon group-containing compound (it is preferable that the compound have 4 to 100 carbon atoms) (hereinafter, referred to as an "unsaturated hydrocarbon group-modified phenol derivative") with aldehydes, or a reaction product of a phenol resin and an unsaturated hydrocarbon group-containing compound.

As the phenol derivative mentioned here, the same as described above as the raw material for the phenol resin as the (A) component can be used.

Preferably, the unsaturated hydrocarbon group of the unsaturated hydrocarbon group containing compound includes not less than two unsaturated group from the viewpoint of the adhesion and thermal shock resistance of the resist pattern. Moreover, from the viewpoint of compatibility in use as a resin composition and flexibility of a cured film, the unsaturated hydrocarbon group containing compound preferably has 8 to 80 carbon atoms, and more preferably has 10 to 60 carbon atoms.

Examples of the unsaturated hydrocarbon group containing compound include unsaturated hydrocarbons having 4 to 100 carbon atoms, polybutadiene having a carboxyl group, epoxidated polybutadiene, linoleyl alcohol, oleyl alcohol, unsaturated fatty acids, and unsaturated fatty acid esters. Examples of suitable unsaturated fatty acids include crotonic acid, myristoleic acid, palmitoleic acid, oleic acid, elaidic acid, vaccenic acid, gadoleic acid, erucic acid, nervonic acid, linoleic acid, α-linoleic acid, eleostearic acid, stearidonic acid, arachidonic acid, eicosapentaenoic acid, clupanodonic acid, and docosahexaenoic acid. Among them, vegetable oil of unsaturated fatty acid esters is particularly preferable.

The vegetable oil is ester of glycerol and unsaturated fatty acids and includes nondrying oil having an iodine number of not more than 100, semi-drying oil having an iodine number more than 100 and less than 130, and drying oil having an iodine number of not less than 130. Examples of the nondrying oil include olive oil, morning glory seed oil, cashew apple oil, sasanqua oil, camellia oil, castor oil, and peanut oil. Examples of the semi-drying oil include corn oil, cotton seed oil, and sesame oil. Examples of the drying oil include tung oil, linseed oil, soybean oil, walnut oil, safflower oil, sunflower oil, perilla oil, and poppy seed oil. Processed vegetable oils obtained by processing these vegetable oils may also be used.

Among these vegetable oils, from the viewpoint of preventing gelation accompanied by excessive progress of the reaction and improving yield in a reaction of phenol or a derivative thereof or a reaction of a phenol resin and a vegetable oil, it is preferable that nondrying oil be used. Meanwhile, from the viewpoint of improving adhesion, mechanical properties, and thermal shock resistance of the resist pattern, it is preferable that drying oil be used. Among drying oils, because the effect according to the present invention can be demonstrated more effectively and surely, tung oil, linseed oil, soybean oil, walnut oil, and safflower oil are preferable, and tung oil and linseed oil are more preferable. One of these vegetable oils is used alone, or not less than two are used in combination.

Preferably, the reaction of phenol or a derivative thereof and unsaturated hydrocarbon group containing compound is performed at 50 to 130° C. From the viewpoint of improving flexibility of the cured film (resist pattern), in the reaction ratio of the phenol or a derivative thereof and the unsaturated hydrocarbon group containing compound, the unsaturated hydrocarbon group containing compound is preferably 1 to 100 parts by mass based on 100 parts by mass of the phenol or a derivative thereof, and more preferably 5 to 50 parts by mass. The flexibility of the cured film is likely to deteriorate when the unsaturated hydrocarbon group containing compound is less than 1 part by mass, while the thermal resistance of the cured film is likely to deteriorate when the unsaturated hydrocarbon group containing compound exceeds 100 parts by mass. P-toluenesulfonic acid, trifluoro methanesulfonic acid, and the like may be used as a catalyst for the above-mentioned reaction when necessary.

The unsaturated hydrocarbon group modified phenol derivative produced by the above-mentioned reaction is polycondensed with aldehydes to produce a phenol resin modified by an unsaturated hydrocarbon group containing compound. Aldehydes are selected from formaldehyde, acetaldehyde, and furfural, benzaldehyde, hydroxybenzaldehyde, methoxybenzaldehyde, hydroxyphenylacetaldehyde, methoxyphenyacetaldehyde, crotonaldehyde, chloroacetaldehyde, chlorophenylacetaldehyde, acetone, glyceraldehyde, glyoxylic acid, methyl glyoxylate, phenyl glyoxylate, hydroxyphenyl glyoxylate, formylacetic acid, methyl formylacetate, 2-formylpropionic acid, methyl 2-formylpropionate, pyruvic acid, Levulinic acid, 4-acetylbutyric acid, acetonedicarboxylic acid, 3,3'-4,4'-benzophenonetetracarboxylic acid, and the like. Precursors of formaldehyde such as paraformaldehyde and trioxane may be used. One of these aldehydes is used alone, or not less than two are used in combination.

The reaction of the above-mentioned aldehydes with the above-mentioned unsaturated hydrocarbon group modified phenol derivative is a polycondensation reaction. Conventionally known synthetic conditions on the phenol resins can be used. The reaction is preferably performed in the presence of a catalyst such as an acid or a base, and more preferably, an acid catalyst is used. Examples of the acid catalyst include hydrochloric acid, sulfuric acid, formic acid, acetic acid, p-toluenesulfonic acid, and oxalic acid, for example. One of these acid catalysts is used alone, or not less than two are used in combination.

Preferably, the above-mentioned reaction is usually performed at a reaction temperature of 100 to 120° C. A reaction time varies depending on a kind and an amount of the catalyst to be used, and is usually 1 to 50 hours. After the reaction is terminated, the reaction product is dehydrated under reduced pressure at temperature of not more than 200° C. to obtain a phenol resin modified by the unsaturated hydrocarbon group containing compound. Solvents such as toluene, xylene, and methanol can be used for the reaction.

The phenol resin modified by the unsaturated hydrocarbon group containing compound can be obtained by polycondensing the above-mentioned unsaturated hydrocarbon group-modified phenol derivative and a compound other than phenol, such as m-xylene with aldehydes. In this case, preferably, a mole ratio of the compound other than phenol is less than 0.5 to the compound obtained by reacting the phenol derivative with the unsaturated hydrocarbon group containing compound.

The (A2) component can also be obtained by reacting a phenol resin with an unsaturated hydrocarbon group-containing compound. The phenol resin is a polycondensation product of a phenol derivative and aldehydes. In this case, as the phenol derivative and aldehydes, the same as the phenol derivative and aldehydes described above can be used, the phenol resin can be synthesized on a known condition as described above.

Specific examples of the phenol resin obtained from the phenol derivative and aldehydes include phenol/formaldehyde novolak resins, cresol/formaldehyde novolak resins, xylylenol/formaldehyde novolak resins, resorcinol/formaldehyde novolak resins, and phenol-naphthol/formaldehyde novolak resins.

As the unsaturated hydrocarbon group-containing compound reacted with the phenol resin, the same as the unsaturated hydrocarbon group-containing compound described above can be used.

It is preferable that the reaction of the phenol resin and the unsaturated hydrocarbon group-containing compound be usually performed at 50 to 130° C. Moreover, from the viewpoint of improving flexibility of the cured film (resist pattern), it is preferable that as the reaction proportion of the unsaturated hydrocarbon group-containing compound to the phenol resin, the unsaturated hydrocarbon group-containing compound be 1 to 100 parts by mass based on 100 parts by mass of the phenol resin, it is more preferable that the reaction proportion be 2 to 70 parts by mass based on 100 parts by mass of the phenol resin, and it is still more preferable that the reaction proportion be 5 to 50 parts by mass based on 100 parts by mass of the phenol resin. If the unsaturated hydrocarbon group-containing compound is less than 1 part by mass, the flexibility of the cured film tends to be reduced; if the unsaturated hydrocarbon group-containing compound is more than 100 parts by mass, possibility of gelation during the reaction tends to be increased, and the heat resistance of the cured film tends to be reduced. At this time, when necessary, p-toluenesulfonic acid, trifluoromethanesulfonic acid, and the like may be used as a catalyst. In the reaction, a solvent such as toluene, xylene, methanol, and tetrahydrofuran can be used.

It is thought that the phenol resin modified with the unsaturated hydrocarbon group-containing compound obtained by such a method is a compound in which the unsaturated hydrocarbon group-containing compound is reacted in the ortho-position or para-position with respect to the hydroxyl group of the phenol resin.

By further reacting the remaining phenolic hydroxyl group in the phenol resin modified with the unsaturated hydrocarbon group-containing compound produced by such a method with a polybasic acid anhydride, the phenol resin modified with an acid can be used as the (A2) component. By modifying the polybasic acid anhydride with an acid, a carboxy group is introduced, solubility of the (A2) component in the alkali aqueous solution (developer) is further improved.

The polybasic acid anhydride will not be particularly limited as long as the polybasic acid anhydride has an acid anhydride group which is formed by dehydration condensation of carboxy groups of a polybasic acid having a plurality of carboxy groups. Examples of the polybasic acid anhydride includes dibasic acid anhydrides such as phthalic acid anhydride, succinic acid anhydride, octenylsuccinic acid anhydride, pentadodecenylsuccinic acid anhydride, maleic acid anhydride, and itaconic acid anhydride, tetrahydrophthalic acid anhydride, hexahydrophthalic acid anhydride, methyltetrahydrophthalic acid anhydride, methylhexahydrophthalic acid anhydride, Nadic acid anhydride, 3,6-endo-methylene-tetrahydrophthalic acid anhydride, methyl-endo-methylene-tetrahydrophthalic acid anhydride, tetrabromophthalic acid anhydride, and trimellitic acid anhydride; and aromatic 4-basic acid dianhydrides such as biphenyltetracarboxylic acid dianhydride, naphthalenetetracarboxylic acid dianhydride, diphenyl ether tetracarboxylic acid dianhydride, butanetetracarboxylic acid dianhydride, cyclopentanetetracarboxylic acid dianhydride, pyromellitic acid dianhydride, and benzophenonetetracarboxylic acid dianhydride. One of these is used alone, or not less than two are used in combination. Among these, the polybasic acid anhydride is preferably dibasic acid anhydrides, and more preferably, not less than one selected from the group consisting of tetrahydro phthalic anhydride, succinic anhydride, and hexahydro phthalic anhydride. In this case, advantageously, a resist pattern having a better shape can be formed.

The reaction of a phenolic hydroxyl group with a polybasic acid anhydride can be performed at 50 to 130° C. In the reaction, preferably 0.1 to 0.8 mol of the polybasic acid anhydride is reacted with 1 mol of phenolic hydroxyl groups, more preferably 0.15 to 0.6 mol of the polybasic acid anhydride is reacted, and still more preferably 0.2 to 0.4 mol of the polybasic acid anhydride is reacted. The polybasic acid anhydride less than 0.1 mol is likely to deteriorate development properties, while the polybasic acid anhydride exceeding 0.8 mol is likely to deteriorate alkali resistance in an unexposed portion.

The above-mentioned reaction may include a catalyst when necessary from the viewpoint of a quick reaction. Examples of the catalyst include tertiary amines such as triethylamine, quarternary ammonium salts such as triethylbenzylammonium chloride, imidazole compounds such as 2-ethyl-4-methylimidazole, and phosphorus compounds such as triphenylphosphine.

It is preferable that the acid value of the phenol resin further modified with a polybasic acid anhydride be 30 to 200 mgKOH/g, it is more preferable that the acid value be 40 to 170 mgKOH/g, and it is still more preferable that the acid value be 50 to 150 mgKOH/g. If the acid value is less than 30 mgKOH/g, compared to the case where the acid value is within the range, alkali development tends to need a longer time; if the acid value is more than 200 mgKOH/g, compared to the case where the acid value is within the range, resistance against developer of an unexposed portion tends to be reduced.

In consideration of solubility to the alkaline aqueous solution and a balance between photosensitivity and the physical properties of the cured film, the molecular weight of the (A2) component is preferably 1000 to 500,000 in a weight average molecular weight, more preferably 2000 to 200,000, and still more preferably 2,000 to 100,000. Here, the weight average molecular weight is a value obtained by performing measurement by a gel permeation chromatography method and conversion based on a standard polystyrene calibration curve.

<(B) Component: Compound Producing an Acid by Light>

A compound as the (B) component that produces an acid by light (which may be referred to as a "photoacid generator") is used as a sensitizing agent. The (B) component has function to produce an acid by irradiation of the (B) component with light and increase solubility of portions irradiated with the light to an alkaline aqueous solution. As the (B) component, compounds usually referred to as a photoacid generator can be used. Examples of the (B) component include o-quinone diazide compounds, aryldiazonium salts, diaryliodonium salts, and triarylsulfonium salt. Among these, the o-quinone diazide compounds are preferable for their high sensitivity.

The o-quinone diazide compounds may be obtained by a method, for example, by performing a condensation reaction of o-quinonediazidosulfonyl chlorides with a hydroxy compound or an amino compound in the presence of a dehydrochlorination agent.

Examples of o-quinonediazidosulfonyl chlorides used for the reaction include benzoquinone-1,2-diazido-4-sulfonyl chloride, naphthoquinone-1,2-diazido-5-sulfonyl chloride, and naphthoquinone-1,2-diazido-4-sulfonyl chloride.

Examples of the hydroxy compounds used for the reaction include hydroquinone, resorcinol, pyrogallol, bisphenol A, bis(4-hydroxyphenyl)methane, 2,2-bis(4-hydroxyphenyl) hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethyl indeno [2,1-a]indene, tris(4-hydroxyphenyl)methane, tris(4-hydroxyphenyl)ethane, 1,1-bis(4-hydroxyphenyl)-1-[4-{1-(4-hydroxyphenyl)-1-methylethyl}phenyl]ethane.

Examples of the amino compounds used for the reaction include p-phenylenediamine, m-phenylenediamine, 4,4'-diaminodiphenylether, 4,4'-diaminodiphenylmethane, 4,4'-diaminodiphenyl sulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

Examples of the dehydrochlorination agent used for the reaction include sodium carbonate, sodium hydroxide, sodium hydrogencarbonate, potassium carbonate, potassium hydroxide, trimethylamine, triethylamine, and pyridine. As a reaction solvent, dioxane, acetone, methyl ethyl ketone, tetrahydrofuran, diethylether, N-methylpyrrolidone, and the like are used.

Preferably, o-quinonediazidosulfonyl chloride and the hydroxy compound and/or the amino compound are blended so that the total number of moles of hydroxy groups and amino groups may be 0.5 to 1 to 1 mol of o-quinonediazidosulfonyl chloride. The preferable proportion of o-quinonediazidosulfonyl chloride to the dehydrochlorination agent is within 0.95/1 mol equivalent to 1/0.95 mol equivalent.

The preferable reaction temperature in the above-mentioned reaction is 0 to 40° C., and the preferable reaction time is 1 to 10 hours.

From the viewpoint of a difference in a dissolution rate between an exposed portion and an unexposed portion and tolerance of sensitivity, the blending amount of a (B) component is preferably 3 to 100 parts by mass based on 100 parts by mass of the (A) component, more preferably 5 to 50 parts by mass, and much more preferably 5 to 30 parts by mass.

<(C) Component: Thermal Crosslinking Agent>

The thermal crosslinking agent is a compound having a structure which reacts with the (A) component to be crosslinked when a patterned photosensitive resin film is heated and cured. This can prevent brittleness and melting of the film. The thermal crosslinking agent is preferably selected from compounds having a phenolic hydroxyl group, compounds having a hydroxymethylamino group, and compounds having an epoxy group.

The compounds having a phenolic hydroxyl group used as a thermal crosslinking agent are different from the (A) component, and the examples of the specific structure thereof may include those described later. Such compounds having a phenolic hydroxyl group not only can function as the thermal crosslinking agent, but also preferably increase a dissolution rate of an exposed portion at the time of development of the exposed portion by an alkaline aqueous solution to improve sensitivity. A molecular weight of such a compound having a phenolic hydroxyl group is preferably not more than 2,000. In consideration of a balance between solubility to an alkaline aqueous solution and photosensitivity and the physical properties of the cured film, a weight average molecular weight of the compound is preferably 94 to 2,000, more preferably 108 to 2,000, and much more preferably 108 to 1,500.

Conventionally known compounds can be used as the compound having a phenolic hydroxyl group. The compound represented by the following general formula (I) is particularly preferable for an excellent balance between the effect of accelerating dissolution of the exposed portion and the effect of preventing melting at the time of curing the photosensitive resin film:

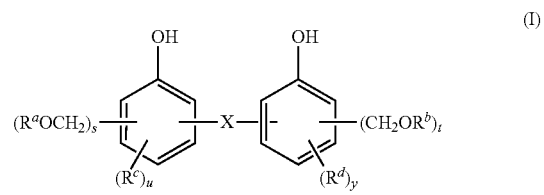

wherein X represents a single bond or a divalent organic group, $R^a$, $R^b$, $R^c$, and $R^d$ each represent a hydrogen atom or a univalent organic group separately, s and t each represent an integer of 1 to 3 separately, and u and v each represent an integer of 0 to 4 separately.

In the general formula (1), a compound in which X is single-bonded (that is, a compound in which two benzene rings are bonded via a single bond) is a biphenol (dihydroxy biphenyl) derivative. Examples of a divalent organic group represented by X include alkylene groups having 1 to 10 carbon atoms such as a methylene group, an ethylene group, a propylene group and the like, alkylidene groups having 2 to 10 carbon atoms such as an ethylidene group and the like, arylene groups having 6 to 30 carbon atoms such as a phenylene groups and the like, groups in which a part of or all of the hydrogen atoms of these hydrocarbon groups are substituted for halogen atoms such as fluorine atoms, a sulfonyl group, a carbonyl group, an ether bond, a thioether bond, and an amido bond. Among these, preferably, X is a divalent organic group represented by the following general formula (II):

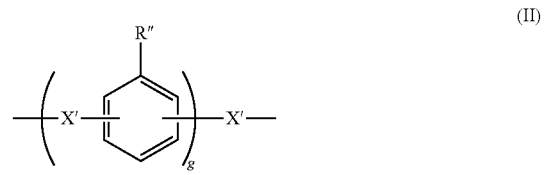

wherein X' represents a single bond, alkylene group (for example, alkylene groups having 1 to 10 carbon atoms), alkylidene groups (for example, alkylidene groups having 2 to 10 carbon atoms), groups in which a part of or all of the hydrogen atoms of these hydrocarbon groups are substituted for a halogen atom, a sulfonyl group, a carbonyl group, an ether bond, a thioether bond, and an amide bond; R" represents a hydrogen atom, a hydroxyl group, an alkyl group, or a halo alkyl group, and g represents an integer of 1 to 10; a plurality of R"s may be the same, or may be different from each other.

Examples of the compound having a hydroxymethylamino group include nitrogen-containing compounds in which all or a part of active methylol groups are alkyl-etherified, such as (poly)(N-hydroxymethyl)melamine, (poly)(N-hydroxymethyl)glycoluryl, (poly)(N-hydroxymethyl)benzoguanamine, (poly)(N-hydroxymethyl)urea. Here, examples of alkyl groups in alkyl ether include a methyl group, an ethyl group, a butyl group, or a combination of these. An oligomer ingredient obtained by self-condensation may be contained in part. Specific examples include hexakis(methoxymethyl)

melamine, hexakis(butoxymethyl)melamine, tetrakis(methoxymethyl)glycoluryl, tetrakis(butoxymethyl)glycoluryl, tetrakis(methoxymethyl)urea, 1,1-bis{3,5-bis(methoxymethyl)-4-hydroxyphenyl}methane, and the like.

Conventionally known compounds can be used as the compound having an epoxy group. Specific examples of those include a bisphenol A type epoxy resin, a bisphenol F type epoxy resin, a phenol novolak type epoxy resin, a cresol novolak type epoxy resin, a cycloaliphatic epoxy resin, glycidyl amine, a heterocyclic epoxy resin, polyalkylene glycol diglycidyl ether, and the like.

The following can be used as the (C) component other than the compounds mentioned above: aromatic compounds having a hydroxymethyl group, such as bis[3,4-bis(hydroxymethyl)phenyl]ether and 1,3,5-tris(1-hydroxy-1-methylethyl)benzene; compounds having a maleimide group, such as bis(4-maleimide phenyl)methane and 2,2-bis[4-(4'-maleimide phenoxy)phenyl]propane; compounds having a norbornene skeleton; polyfunctional acrylate compounds; compounds having an oxetanyl group; compounds having a vinyl group; and blocked isocyanate compounds.

Among the (C) mentioned above, the compounds having a phenolic hydroxyl group and/or the compounds having a hydroxymethylamino group are preferable from the viewpoint of improvement in sensitivity and thermal resistance.

A blending amount of the (C) component is preferably 1 to 50 parts by mass based on 100 parts by mass of the (A) component from the viewpoint of a developing time, tolerance of a ratio of a remaining unexposed portion in the film, and the physical properties of the cured film, more preferably 2 to 30 parts by mass, and much more preferably 3 to 25 parts by mass. One of the thermal crosslinking agent mentioned above is used alone, or not less than two are used in combination.

<(D) Component: Silane Compound>

The (D) component is a silane compound having at least one functional group selected from an epoxy group and a sulfide group. By use of such a silane compound, adhesiveness to the metal substrate can be improved.

Hereinafter, as examples of the (D) component, a silane compound (D1) having an epoxy group and a silane compound (D2) having a sulfide group will be described individually.

As the silane compound (D1) having an epoxy group, the silane compound represented by the following formula (1) is preferable:

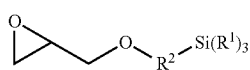

(1)

wherein $R^1$ represents a monovalent organic group, and $R^2$ group represents a divalent organic group.

Examples of the silane compound (D1) having an epoxy group include: trimethylsilylacetic acid oxiran-2-ylmethyl, triethylsilylacetic acid oxiran-2-ylmethyl, (2-glycidyloxy-2-propenyl)trimethoxysilane, (2-glycidyloxy-2-propenyl)triethoxysilane, (2-glycidyloxy-2-butenyl)trimethoxysilane, (2-glycidyloxy-3-butenyl)trimethoxysilane, (2-glycidyloxy-2-butenyl)triethoxysilane, (2-glycidyloxy-3-butenyl)triethoxysilane, (2-glycidyloxy-2-pentenyl)trimethoxysilane, (2-glycidyloxy-3-pentenyl)trimethoxysilane, (2-glycidyloxy-4-pentenyl)trimethoxysilane, (2-glycidyloxy-2-pentenyl)triethoxysilane, (2-glycidyloxy-3-pentenyl)triethoxysilane, (2-glycidyloxy-4-pentenyl)triethoxysilane, (2-glycidyloxyethyl)(methyl)dimethoxysilane, (2-glycidyloxypropyl)(methyl)dimethoxysilane, (2-glycidyloxypropyl)(methyl)diethoxysilane, [β-(glycidyloxy)propyl]methoxysilane, β-glycidyloxyethyltrimethoxysilane, (1-glycidyloxy-1-propenyl)trimethoxysilane, (1-glycidyloxy-2-propenyl)trimethoxysilane, (1-glycidyloxy-1-propenyl)triethoxysilane, (1-glycidyloxy-2-propenyl)triethoxysilane, (1-glycidyloxy-1-butenyl)trimethoxysilane, (1-glycidyloxy-2-butenyl)trimethoxysilane, (1-glycidyloxy-butenyl)trimethoxysilane, (1-glycidyloxy-1-butenyl)triethoxysilane, (1-glycidyloxy-2-butenyl)triethoxysilane, (1-glycidyloxy-3-butenyl)triethoxysilane, (1-glycidyloxy-1-pentenyl)trimethoxysilane, (1-glycidyloxy-2-pentenyl)trimethoxysilane, (1-glycidyloxy-3-pentenyl)trimethoxysilane, (1-glycidyloxy-4-pentenyl)trimethoxysilane, (1-glycidyloxy-1-pentenyl)triethoxysilane, (1-glycidyloxy-2-pentenyl)triethoxysilane, (1-glycidyloxy-3-pentenyl)triethoxysilane, (1-glycidyloxy-4-pentenyl)triethoxysilane, (glycidyloxymethyl)(methyl)dimethoxysilane, (glycidyloxymethyl)(methyl)diethoxysilane, (1-glycidyloxyethyl)(methyl)dimethoxysilane, (1-glycidyloxyethyl)(methyl)diethoxysilane, (1-glycidyloxypropyl)(methyl)dimethoxysilane, (1-glycidyloxypropyl)(methyl)diethoxysilane, (4-glycidyloxy-4-pentenyl)trimethoxysilane, (4-glycidyloxy-4-pentenyl)triethoxysilane, [3-(oxiranylmethoxy)propyl]silanetriol, [3-(oxiranylmethoxy)propyl](methyl)silanediol, 3-(trimethoxysilyl)propyl glycidyl ether, 3-(triethoxysilyl)propyl glycidyl ether, [3-(glycidyloxy)propyl]dimethylethoxysilane, [3-(glycidyloxy)propyl](methyl)dimethoxysilane, [3-(glycidyloxy)propyl](methyl)diethoxysilane, (3-glycidyloxy-3-butenyl)trimethoxysilane, (3-glycidyloxy-3-butenyl)triethoxysilane, (3-glycidyloxy-3-pentenyl)trimethoxysilane, (3-glycidyloxy-4-pentenyl)trimethoxysilane, (3-glycidyloxy-3-pentenyl)triethoxysilane, (3-glycidyloxy-4-pentenyl)triethoxysilane, 3-(glycidyloxy)propyltrimethylsilane, [3-(glycidyloxy)propyl]ethoxysilane, [3-(glycidyloxy)propyl]methoxysilane, [3-(glycidyloxy)propyl]ethyldiethoxysilane, [3-(glycidyloxy)propyl]triethylsilane, and 3-(glycidyloxy)propylsilane.

In the formula (1), $R^1$ is not particularly limited as long as $R^1$ is an organic group. Because of industrial availability, it is preferable that $R^1$ contain an alkoxy group or an alkoxyalkyl group. Among these, particularly, it is preferable that $R^1$ contain an alkoxy group such as a methoxy group or an ethoxy group.

In the formula (1), $R^2$ is not particularly limited as long as $R^2$ is a divalent organic group. Because of industrial availability, it is preferable that $R^2$ be a linear alkylene group represented by —$(CH_2)_n$— (n=integer of 1 to 6).

As the silane compound (D2) having a sulfide group, the silane compound represented by the formula (2) is preferable:

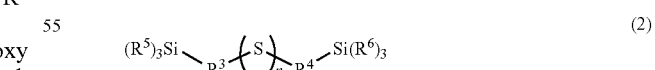

(2)

wherein $R^3$ and $R^4$ each independently represent a divalent organic group, $R^5$ and $R^6$ each independently represent a monovalent organic group, and n represents an integer of 1 to 6.

Examples of the silane compound (D2) having a sulfide group include bis(trimethylsilylmethyl)sulfide, bis(triethoxysilylmethyl)sulfide, bis(trimethoxysilylmethyl)sulfide, bis(triethylsilylmethyl)sulfide, bis[2-(triethylsilyl)ethyl]sulfide, bis[2-(trimethylsilyl)ethyl]sulfide, bis(3-trimethoxysilylpropyl)sulfide, bis(3-triethoxysilylpropyl)sulfide, bis(3-triethylsilylpropyl)sulfide, bis(3-triethoxysilylpropyl)persulfide, bis(3-trimethoxysilylpropyl)persulfide, bis(3-trimethylsilylpropyl)persulfide, bis(3-ethoxydimethylsilylpropyl)persulfide, bis(3-hydroxydimethylsilylpropyl)persuffide, bis(3-triethoxysilylpropyl)pertrisulfide, bis(3-trimethoxysilylpropyl)pertrisulfide, bis(3-triethoxysilylpropyl)pertetrasulfide, bis(3-trimethoxysilylpropyl)pertetrasulfide, bis(3-timethylsilylpropyl)pertetrasulfide, bis(3-ethoxydimethylsilylpropyl)pertetrasulfide, bis(3-hydroxydimethylsilylpropyl)pertetrasulfide, bis(2-triethoxysilylbutenyl)pertetrasulfide, and bis(2-trimethoxysilylbutenyl)pertetrasulfide.

In the formula (2), $R^5$ and $R^6$ are not particularly limited as long as $R^5$ and $R^6$ each independently are a monovalent organic group. Because of industrial availability, it is preferable that $R^5$ and $R^6$ contain an alkoxy group or an alkoxyalkyl group. Among these, particularly, it is particularly preferable that $R^5$ and $R^6$ contain an alkoxy group such as a methoxy group or an ethoxy group.

In the formula (2), $R^3$ and $R^4$ are not particularly limited as long as $R^3$ and $R^4$ each independently are a divalent organic group. Because of industrial availability, it is preferable that $R^3$ and $R^4$ be a linear alkylene group represented by —$(CH_2)_n$— (n=integer of 1 to 6).

In the formula (2), n is not particularly limited as long as n is an integer of 1 to 6; because of industrial availability, it is particularly preferable that n be an integer of 2 to 4.

As the (D) component, the sulfide compound represented by the formula (2) is particularly preferable. Moreover, the (D) component may comprise one of the silane compounds, or may comprise not less than two in combination.

Moreover, the silane compound that forms the (D) component may further contain a silane compound other than the silane compound having one of the structures represented by the formulas (1) and (2). Examples of such a silane compound include vinyltriethoxysilane, γ-methacryloxypropyltriethoxysilane, urea propyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene. These silane compounds are used alone, or not less than two are used in combination.

From the viewpoint of adhesiveness to the metal wiring and storage stability of the photosensitive resin composition, it is preferable that the blending amount of the (D) silane compound be 0.1 to 20 parts by mass based on 100 parts by mass of the (A) component, it is more preferable that the blending amount be 0.5 to 10 parts by mass based on 100 parts by mass of the (A) component, and it is particularly preferable that the blending amount be 1 to 5 parts by mass based on 100 parts by mass of the (A) component.

The positive-type photosensitive resin composition according to the present embodiment may comprise only the (A) to (D) components, or may further comprise one or not less than two of the components below in addition to the (A) to (D) components.

<(E) Component: Acrylic Resin>

The positive-type photosensitive resin composition according to the present embodiment can further contain an acrylic resin (E). If the positive-type photosensitive resin composition contains the acrylic resin (E), thermal shock resistance can be improved while good photosensitive properties are kept. Further, it is preferable that the (E) component be an acrylic resin having the structure units represented by the following formulas (3) and (4). If the positive-type photosensitive resin composition contains the acrylic resin, the effect of being capable of improving thermal shock resistance while keeping good photosensitive properties can be further enhanced. The (E) component may comprise one of the acrylic resins only, or may comprise not less than two.

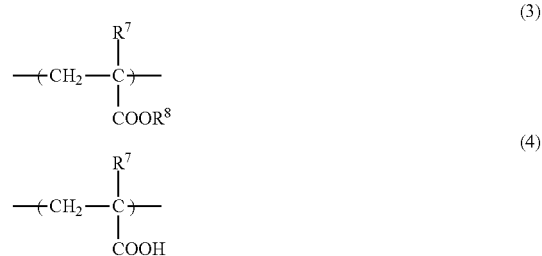

wherein $R^7$ represents a hydrogen atom or a methyl group, and $R^8$ represents an alkyl group having 4 to 20 carbon atoms.

Moreover, in the formula (3), from the viewpoint of being capable of improving sensitivity, resolution, and thermal shock resistance, $R^8$ is preferably an alkyl group having 4 to 16 carbon atoms, more preferably an alkyl group having 4 carbon atoms, and further preferably an n-butyl group. Examples of a polymerizable monomer that gives the structure unit represented by the formula (4) include alkyl (meth)acrylic acid ester.

Examples of the alkyl (meth)acrylic acid ester include a compound represented by the following formula (V):

Here, in the formula (V), $R^9$ represents a hydrogen atom or a methyl group, and $R^{10}$ represents an alkyl group having 4 to 20 carbon atoms.

Examples of an alkyl group having 1 to 20 carbon atoms and represented by $R^{10}$ include a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, and structural isomers thereof. Examples of the polymerizable monomer represented by the formula (V) include (meth)acrylic acid butyl ester, (meth)acrylic acid pentyl ester, (meth)acrylic acid hexyl ester, (meth)acrylic acid heptyl ester, (meth)acrylic acid octyl ester, (meth)acrylic acid nonyl ester, (meth)acrylic acid decyl ester, (meth)acrylic acid undecyl ester, (meth)acrylic acid dodecyl ester, (meth)acrylic acid tridecyl ester, (meth)acrylic acid tetradecyl ester, (meth)acrylic acid pentadecyl ester, (meth)

acrylic acid hexadecyl ester, (meth)acrylic acid heptadecyl ester, (meth)acrylic acid octadecyl ester, (meth)acrylic acid nonadecyl ester, and (meth)acrylic acid eicosyl ester. One of these polymerizable monomers is used alone, or not less than two are used in combination.

Moreover, examples of a polymerizable monomer that gives the structure unit represented by the formula (4) include acrylic acid and methacrylic acid.

In the acrylic resin as the (E) component, it is preferable that the composition ratio of the structure unit represented by the formula (3) be 50 to 95 mol % based on the total amount of the (E) component, it is more preferable that the composition ratio be 60 to 90 mol % based on the total amount of the (E) component, and it is particularly preferable that the composition ratio be 70 to 85 mol % based on the total amount of the (E) component. If the composition ratio of the structure unit represented by the formula (3) is 50 to 95 mol %, the thermal shock resistance of the cured film of the positive-type photosensitive resin composition can be further improved.

Moreover, in the acrylic resin as the (E) component, the composition ratio of the structure unit represented by the formula (4) is 5 to 50 mol % based on the total amount of the (E) component, it is preferable that the composition ratio be 5 to 35 mol % based on the total amount of the (E) component, it is more preferable that the composition ratio be 10 to 30 mol % based on the total amount of the (E) component, and it is particularly preferable that the composition ratio be 15 to 25 mol % based on the total amount of the (E) component. If the composition ratio of the structure unit represented by the formula (4) is 5 to 35 mol %, compatibility with the (A) component and developability of the positive-type photosensitive resin composition can be further improved.

Moreover, from the viewpoint of being capable of further improving compatibility with the (A) component, adhesion of the resist pattern to the substrate, and mechanical properties and thermal shock resistance of the resist pattern, it is more preferable that the (E) component contain an acrylic resin having the structure unit represented by the formula (3), the structure unit represented by the formula (4), and the structure unit represented by the following formula (5). If the (E) component is the acrylic resin, interaction between the (E) component and the (A) alkali-soluble resin having a phenolic hydroxyl group becomes good, and compatibility is further improved.

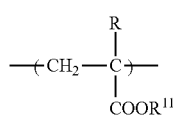

(5)

wherein R represents a hydrogen atom or a methyl group, and $R^{11}$ represents a monovalent organic group having a primary, secondary, or tertiary amino group.

Examples of a polymerizable monomer that gives the structure unit represented by the following formula (5) include aminoethyl (meth)acrylate, N-methylaminoethyl (meth)acrylate, N,N-dimethylaminoethyl (meth)acrylate, N-ethylaminoethyl (meth)acrylate, N,N-diethylaminoethyl (meth)acrylate, aminopropyl (meth)acrylate, N-methylaminopropyl (meth)acrylate, N,N-dimethylaminopropyl (meth)acrylate, N-ethylaminopropyl (meth)acrylate, N,N-diethylaminopropyl (meth)acrylate, aminoethyl (meth)acrylamide, N-methylaminoethyl (meth)acrylamide, N,N-dimethylaminoethyl (meth)acrylamide, N-ethylaminoethyl (meth)acrylamide, N,N-diethylaminoethyl (meth)acrylamide, aminopropyl (meth)acrylamide, N-methylaminopropyl (meth)acrylamide, N,N-dimethylaminopropyl (meth)acrylamide, N-ethylaminopropyl (meth)acrylamide, N,N-diethylaminopropyl (meth)acrylamide, piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate, and 2-(piperidin-4-yl)ethyl (meth)acrylate. One of these polymerizable monomers is used alone, or not less than two are used in combination. Among these, particularly, from the viewpoint of being capable of further improving adhesion of the resist pattern to the substrate, and mechanical properties and thermal shock resistance of the resist pattern, it is particularly preferable that in the formula (5), $R^{11}$ be a monovalent organic group represented by the following formula (6):

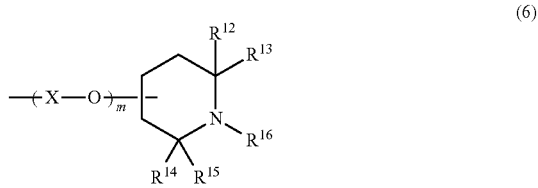

(6)

wherein X represents an alkylene group having 1 to 5 carbon atoms, $R^{12}$ to $R^{16}$ each independently represent a hydrogen atom or an alkyl group having 1 to 20 carbon atoms, and m is an integer of 0 to 10.

Examples of a polymerizable monomer that gives the structure unit in which $R^{11}$ in the formula (5) is represented by the monovalent organic group represented by the formula (6) include piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate, and 2-(piperidin-4-yl)ethyl (meth)acrylate. Among these, 1,2,2,6,6-pentamethylpiperidin-4-yl methacrylate is commercially available as FA-711MM, and 2,2,6,6-tetramethylpiperidin-4-yl methacrylate is commercially available as FA-712BM (both are made by Hitachi Chemical Co., Ltd.).

In the acrylic resin as the (E) component, it is preferable that the composition ratio of the structure unit represented by the formula (6) be 0.3 to 10 mol % based on the total amount of the (E) component, it is more preferable that the composition ratio be 0.4 to 8 mol % based on the total amount of the (E) component, and it is particularly preferable that the composition ratio be 0.5 to 7 mol % based on the total amount of the (E) component.

Moreover, from the viewpoint of being capable of further improving sensitivity, it is preferable that the (E) component contain an acrylic resin having the structure unit represented by the formula (3), the structure unit represented by the formula (4), and the structure unit represented by the following formula (7). Such an acrylic resin may further have the structure unit represented by the formula (5).

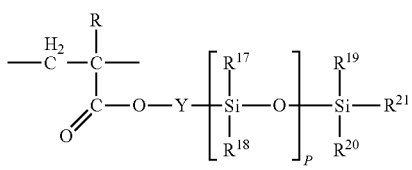

(7)

wherein R represents a hydrogen atom or a methyl group, Y represents an alkylene group having 1 to 5 carbon atoms, $R^{17}$ to $R^{21}$ each independently represent an alkyl group having 1 to 6 carbon atoms, and p is an integer of 1 to 100.

Examples of a polymerizable monomer that gives the structure unit represented by the formula (7) include methacryl-modified silicone oil, which is commercially available as X-22-174 DX, X-22-2426, and X-22-2475 (these are made by Shin-Etsu Chemical Co., Ltd.).

In the acrylic resin as the (E) component, it is preferable that the composition ratio of the structure unit represented by the following formula (7) be 1 to 10 mol % based on the total amount of the (E) component, it is more preferable that the composition ratio be 2 to 5 mol % based on the total amount of the (E) component, and it is particularly preferable that the composition ratio be 3 to 5 mol % based on the total amount of the (E) component.

Moreover, the polymerizable monomer used for synthesis of the acrylic resin that forms the (E) component may further contain a polymerizable monomer other than the polymerizable monomers that give the structure units represented by the formulas (3), (4), (5), (6), and (7), respectively. Examples of such a polymerizable monomer include: esters of vinyl alcohol such as styrene, α-methylstyrene, (meth)acrylic acid benzyl ester, (meth)acrylic acid 4-methylbenzyl ester, (meth)acrylic acid 2-hydroxyethyl ester, (meth)acrylic acid 2-hydroxypropyl ester, (meth)acrylic acid 3-hydroxypropyl ester, (meth)acrylic acid 4-hydroxybutyl ester, acrylonitrile, and vinyl-n-butyl ether; (meth)acrylic acid tetrahydrofurfuryl ester, (meth)acrylic acid glycidyl ester, 2,2,2-trifluoroethyl (meth)acrylate, 2,2,3,3-tetrafluoropropyl (meth)acrylate, (meth)acrylic acid, α-bromo(meth)acrylic acid, α-chloro (meth)acrylic acid, β-furyl(meth)acrylic acid, β-styryl(meth) acrylic acid, maleic acid, maleic anhydride, maleic acid monoesters such as monomethyl maleate, monoethyl maleate, and monoisopropyl maleate; fumaric acid, cinnamic acid, α-cyanocinnamic acid, itaconic acid, crotonic acid, and propiolic acid. One of these polymerizable monomers is used alone, or not less than two are used in combination.

It is preferable that the weight average molecular weight of the (E) component be 2,000 to 100,000, it is more preferable that the weight average molecular weight of the (E) component be 3,000 to 60,000, and it is particularly preferable that the weight average molecular weight of the (E) component be 4,000 to 50,000. If the weight average molecular weight is less than 2,000, the thermal shock resistance of the cured film tends to be reduced; if the weight average molecular weight is more than 100,000, the compatibility with the (A) component and developability tend to be reduced.

From the viewpoint of adhesion, mechanical properties, thermal shock resistance, and photosensitive properties, it is preferable that the blending amount of the (E) component be 1 to 50 parts by mass based on 100 parts by mass of the total amount of the (A) component, it is more preferable that the blending amount of the (E) component be 3 to 30 parts by mass based on 100 parts by mass of the total amount of the (A) component, and it is particularly preferable that the blending amount of the (E) component be 5 to 20 parts by mass based on 100 parts by mass of the total amount of the (A) component.

<(F) Component: Compound that Produces an Acid by Heat>

The positive-type photosensitive resin composition according to the present embodiment can further contain a compound that produces an acid by heat (also referred to as a "thermal acid generator") (F). By use of the (F) component, melt of the pattern can be suppressed. This is because an acid can be produced when the photosensitive resin film after development is heated, and the reaction of the (A) component with the (C) component, namely, a thermal crosslinking reaction is started at a lower temperature; thereby, melt of the pattern can be suppressed.

Moreover, most of the compounds that produce an acid by heat can also produce an acid by irradiation with light; for this reason, if such a compound is used, solubility of an exposed portion in the alkali aqueous solution can be increased. Accordingly, the difference in solubility in the alkali aqueous solution between the unexposed portion and the exposed portion is further increased, and resolution is improved. In the present embodiment, a compound different from the (B) component can be used as the (F) component.

It is preferable that such a compound that produces an acid by heat be a compound that produces an acid by heating at a temperature of 50 to 200° C., for example. The compound that produces an acid by heat is a compound different from the (B) component that is the compound that produces an acid by light, and specific examples thereof include salts formed with a strong acid such as onium salts having function to produce an acid by heat and a base, and imide sulfonate.

Examples of such onium salts include diaryliodonium salts such as aryldiazonium salts, and diphenyliodonium salts; di(alkylaryl)iodonium salts such as diaryliodonium salts and di(t-butylphenyl)iodonium salts; trialkylsulfonium salts such as trimethylsulfonium salts; dialkyl monoarylsulfonium salts such as dimethylphenylsulfonium salts; diaryl monoalkyliodonium salts such as diphenylmethylsulfonium salts; and triarylsulfonium salts. Among these, preferable examples of onium salts can include di(t-butylphenyl)iodonium salts of para-toluenesulfonic acid, di(t-butylphenyl)iodonium salts of trifluoromethanesulfonic acid, trimethylsulfonium salts of trifluoromethanesulfonic acid, dimethylphenylsulfonium salts of trifluoromethanesulfonic acid, diphenylmethylsulfonium salts of trifluoromethanesulfonic acid, di(t-butylphenyl)iodonium salts of nonafluorobutanesulfonic acid, diphenyliodonium salts of camphorsulfonic acid, diphenyliodonium salts of ethanesulfonic acid, dimethylphenylsulfonium salts of benzenesulfonic acid, and diphenylmethylsulfonium salts of toluenesulfonic acid.

Among these, sulfonium salts represented by the following formula (8) are preferable, trialkylsulfonium salts of methanesulfonic acid are more preferable, and trimethylsulfonium salts are particularly preferable.

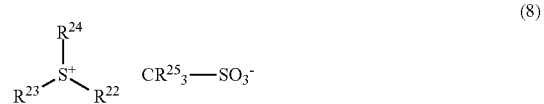

(8)

wherein $R^{22}$, $R^{23}$, and $R^{24}$ each independently represent an alkyl group or an aryl group, and $R^{25}$ represents hydrogen or fluorine.

As the aryl group, a phenyl group or a phenyl group having a substituent is preferable.

As imide sulfonate, for example, naphthoylimide sulfonate and phthalimide sulfonate can be used.

It is preferable that the blending amount of the compound that produces an acid by heat be 0.1 to 30 parts by mass based on 100 parts by mass of the total amount of the (A) component and the (B) component, it is more preferable that the blending amount be 0.2 to 20 parts by mass based on 100 parts by mass of the total amount of the (A) component and the (B) component, and it is still more preferable that the blending amount be 0.3 to 10 parts by mass based on 100 parts by mass of the total amount of the (A) component and the (B) component.

<(G) Component: Elastomer>

The positive-type photosensitive resin composition according to the present embodiment can further contain an elastomer (G). Thereby, the resist pattern to be obtained is more excellent in flexibility, and the mechanical properties and thermal shock resistance of the resist pattern can be further improved. Known elastomers can be used as the elastomer, and it is preferable that the glass transition temperature (Tg) of the polymer that forms the elastomer be not more than 20° C.

Examples of such an elastomer include styrene based elastomers, olefin based elastomers, urethane based elastomers, polyester based elastomers, polyamide based elastomers, and silicone based elastomers. Moreover, the elastomer may be a fine particle elastomer. One of these elastomers can be used alone, or not less than two can be used in combination.

<(H) Component: Solvent>

The positive-type photosensitive resin composition according to the present embodiment can further contain a solvent. If the positive-type photosensitive resin composition contains the solvent, application onto the support substrate can be easier, and an effect that a coating film with a uniform thickness can be formed is obtained. Specific examples of the solvent include γ-butyrolactone, ethyl lactate, propylene glycol monomethyl ether acetate, benzyl acetate, n-butyl acetate, ethoxyethylpropionate, 3-methylmethoxypropionate, N-methyl-2-pyrrolidone, N,N-dimethylformamide, N,N-dimethylacetoamide, dimethylsulfoxide, hexamethylphosphorylamide, tetramethylene sulfone, diethyl ketone, diisobutyl ketone, methyl amyl ketone, cyclohexanone, propylene glycol monomethyl ether, propylene glycol monopropyl ether, propylene glycol monobutyl ether, and dipropylene glycol monomethyl ether.

One of these solvents can be used alone, or not less than two can be used in combination. Moreover, the blending amount is not particularly limited, and it is preferable that the blending amount be adjusted such that the proportion of the solvent in the positive-type photosensitive resin composition is 20 to 90% by mass.

<Other Components>

In addition to the above-mentioned (A) to (D) components, and (E) to (H) components used as necessary, the above-mentioned positive-type photosensitive resin composition may further contain components such as a dissolution accelerator, a dissolution inhibitor, and a surfactant or a leveling agent.

(A Dissolution Accelerator)

By blending a dissolution accelerator with the above-mentioned positive-type photosensitive resin composition, a dissolution rate of an exposed portion at the time of developing the exposed portion by an alkaline aqueous solution can be increased to improve sensitivity and resolution. Conventionally known dissolution accelerators can be used as the dissolution accelerator. Specific examples thereof include compounds having a carboxyl group, a sulfonic acid, and a sulfonamide group.

A blending amount in a case of blending such a dissolution accelerator can be determined by the dissolution rate to an alkaline aqueous solution, and can be 0.01 to 30 parts by mass based on 100 parts by mass of the total amount of the (A) component, for example.

(A Dissolution Inhibitor)

A dissolution inhibitor is a compound that obstructs solubility of the (A) component to an alkaline aqueous solution, and is used in order to control a residual film thickness, the developing time, and contrast. Specific examples thereof include diphenyliodonium nitrate, bis(p-tert-butylphenyl)iodonium nitrate, diphenyliodonium bromide, diphenyliodonium chloride, and diphenyliodonium iodide. From the viewpoint of tolerance of sensitivity and a developing time, a blending amount in a case of blending the dissolution inhibitor is preferably 0.01 to 20 parts by mass based on 100 parts by mass of the total amount of the (A) component, and more preferably 0.01 to 15 parts by mass, and much more preferably 0.05 to 10 parts by mass.

(A Surfactant or a Leveling Agent)

Blending of a surfactant or a leveling agent with the above-mentioned positive-type photosensitive resin composition can improve coating properties, for example, prevent striation (unevenness of thickness), or can improve development properties. Examples of such a surfactant or a leveling agent include polyoxyethylene lauryl ether, polyoxyethylene stearyl ether, polyoxyethylene oleyl ether, and polyoxyethylene octylphenol ether. Examples of commercial products include Megafax F171, F173, and R-08 (made by Dainippon Ink & Chemicals, Inc., trade name), Fluorad FC430, FC431 (Sumitomo 3M Limited, trade name), and Organosiloxane Polymer KP341, KBM303, KBM803 (made by Shin-Etsu Chemical Co., Ltd., trade name).

A blending amount of the total in a case of using the surfactant or the leveling agent is preferably 0.001 to 5 parts by mass based on 100 parts by mass of the (A) component, and more preferably 0.01 to 3 parts by mass.

The positive-type photosensitive resin composition according to the present embodiment can be developed using an alkaline aqueous solution such as tetramethylammonium hydroxide (TMAH). Use of the positive-type photosensitive resin composition can form a resist pattern having sufficiently high sensitivity and resolution, and good adhesion and thermal shock resistance.

<Second Embodiment: Method for Producing Resist Pattern>

A method of producing a resist pattern according to Second Embodiment of the present invention comprises the steps of: applying the positive-type photosensitive resin composition according to First Embodiment onto a support substrate, and drying the applied positive-type photosensitive resin composition to form a photosensitive resin film (film forming step); exposing the photosensitive resin film (exposing step); developing the photosensitive resin film after exposure using an alkali aqueous solution to form a resist pattern (developing step); and heating the resist pattern (heating step).

(Film Forming Step)

In the film forming step, the positive-type photosensitive resin composition is rotary applied onto a support substrate such as a glass substrate, a semiconductor, a metal oxide insulator (such as $TiO_2$ and $SiO_2$), silicon nitride, and the like by spin coating using a spinner or the like. The applied positive-type photosensitive resin composition is dried by heating using a hot plate, an oven, or the like. Thereby, a coating film (photosensitive resin film) of the positive-type photosensitive resin composition is formed on the support substrate.

(An Exposing Step)

At an exposing step, the photosensitive resin film formed on the support substrate is irradiated through a mask with active light such as an ultraviolet ray, a visible ray, and radiation. The (A) component has high transparency to an i line, and can be suitably used to be irradiated with the i line. Post-exposure baking (PEB) can also be performed when necessary after exposing the photosensitive resin film. A temperature of post-exposure baking is preferably 70° C. to 140° C., and a time of post-exposure baking is preferably 1 minute to 5 minutes.

(A Developing Step)

At a developing step, an exposed portion of the photosensitive resin film is removed by a developer after the exposing step to pattern the photosensitive resin film. As the developer, alkaline aqueous solutions such as sodium hydroxide, potassium hydroxide, sodium silicate, ammonia, ethylamine, diethylamine, triethylamine, triethanolamine, and tetramethylammonium hydroxide (TMAH), are used suitably, for example. A base concentration in these aqueous solutions is preferably 0.1 to 10 mass %. Alcohols and a surfactant can also be added to the above-mentioned developer and used. Each of these can be added to 100 parts by mass of the developer preferably within the range of 0.01 to 10 parts by mass and more preferably within the range of 0.1 to 5 parts by mass.

(A Heat-Treating Step)

At a heat-treating step, the patterned photosensitive resin film (resist pattern) can be heated to cure a photosensitive resin composition.

From the viewpoint of sufficient prevention of damages to an electronic component (electronic device) caused by heat, a heating temperature is preferably not more than 250° C., more preferably not more than 200° C., and much more preferably 140 to 200° C. Heat treatment can be performed using an oven such as a quartz tube furnace, a hot plate, a rapid thermal annealing, a vertical diffusion furnace, an infrared curing oven, an electron beam curing oven, and a microwave curing oven, for example. Heat treatment in the air or under an inert atmosphere of nitrogen or the like can also be selected. However, heat treatment under nitrogen can prevent oxidization of the pattern, and is desirable. The range of the above-mentioned desirable heating temperature is lower than a conventional heating temperature, and can reduce damages to the support substrate and the electronic component (electronic device). Accordingly, the electronic component (electronic device) can be manufactured with a high yield by using the method for production of a resist pattern according to the present embodiment. Energy saving in the process is also attained. Further, according to the present embodiment, the positive-type photosensitive resin composition according to First Embodiment is used, and therefore volume shrinkage (cure shrinkage) of a photosensitive polyimide and the like at the heat-treating step can be made small, and can prevent reduced dimensional accuracy.

A heating time at the heating step may be a time enough to cure the positive-type photosensitive resin composition, and is preferably not more than 5 hours in general in consideration of working efficiency. Heating can also be performed using a microwave curing apparatus or a frequency variable microwave curing apparatus other than above-mentioned ovens. Use of these apparatuses allows effective heating of only the photosensitive resin film while the temperature of the substrate and the electronic component (electronic device) is kept at a temperature of not more than 200° C.

In the frequency variable microwave curing apparatus, irradiation with a microwave in a pulse form is performed while the frequency of the microwave is changed. Accordingly, the frequency variable microwave curing apparatus can prevent a standing wave, can heat a substrate surface uniformly, and is preferable. In the case of the substrate including a metal wiring as an electronic component (electronic device) described later, the frequency variable microwave curing apparatus is also preferable because irradiation of the heated body with the microwave in a pulse form while changing the frequency of the microwave can prevent occurrence of discharge from a metal or the like and protect the electronic device from breakage. Heating using a frequency variable microwave is also preferable because the physical properties of the cured film do not deteriorate at a curing temperature lower than that in a case where an oven is used (see J. Photopolym. Sci. Technol., 18, 327-332 (2005)).

The frequency of the frequency variable microwave is generally within the range of 0.5 to 20 GHz. Practically, the frequency thereof is preferably within the range of 1 to 10 GHz, and more preferably within the range of 2 to 9 GHz. The frequency of the microwave used for irradiation is desirably changed continuously. In practice, however, irradiation of a heated body with the microwave is performed by step-wise change of the frequency of the microwave. At that time, the standing wave, discharge from a metal, and the like are more unlikely to occur as an irradiation time with a microwave at a single frequency is shorter as possible. Accordingly, the irradiation time is preferably not more than 1 millisecond, and particularly preferably not more than 100 microseconds.

Although an output of the microwave used for irradiation varies depending on a size of the apparatus or an amount of a heated body, the output is within the range of 10 to 2000 W in general. Practically, the output is preferably 100 to 1000 W, more preferably 100 to 700 W, and most preferably 100 to 500 W. At an output of less than 10 W, it is difficult to heat the heated body for a short time. At an output of more than 2000 W, a temperature is likely to increase rapidly.

Preferably, the microwave is switched ON/OFF in a pulse form for irradiation. Irradiation of a heated body with the microwave in a pulse form is preferable because this can keep a set heating temperature, and can avoid damages to the cured film or the base material. While an irradiation time with the microwave in a pulse form at one time varies depending on conditions, the time is preferably not more than 10 seconds in general.

According to the method for production of the resist pattern mentioned above, a resist pattern having sufficiently high sensitivity and resolution and good pattern shape is obtained. By using the positive-type photosensitive resin composition according to the present embodiment, curing is possible at even a low temperature of not more than 200° C. in the heating step in which a temperature of not less than 300° C. was needed in the conventional heating step. Further, the positive-type photosensitive resin composition according to the present embodiment can prevent peel off from the metal wiring, which was found in the conventional photosensitive novolak resin composition and the like. The cured film formed from the positive-type photosensitive resin composition has a high glass transition temperature. Accordingly, the cured film serves as a surface protective film having high heat resistance. As a result, an electronic component (electronic device) of semiconductor apparatus having high reliability can be obtained with a high yield.

(Third Embodiment: Method for Production of Semiconductor Apparatus)

Next, as an example of the method of producing a resist pattern according to Second Embodiment, a step of producing a semiconductor apparatus that is an electronic component will be described based on the drawings. FIG. 1 to FIG. 5 are schematic sectional views showing one embodiment of a manufacturing step of a semiconductor apparatus having a multi-layered interconnection structure. Moreover, as described later, in the present embodiment, the positive-type photosensitive resin composition according to First Embodiment is used as a photosensitive resin composition for forming a surface protective layer 8.

First, a structure 100 shown in FIG. 1 is prepared. The structure 100 includes a semiconductor substrate 1, such as an Si substrate, having a circuit element; a protective film 2, such as a silicon oxide film, that has a predetermined pattern in which the circuit element is exposed and covers the semiconductor substrate 1; a first conductive layer 3 formed on the exposed circuit element; and an interlayer insulation film 4 made of a polyimide resin or the like and formed by a spin coat method or the like on the protective film 2 and the first conductive layer 3.

Figure 2:
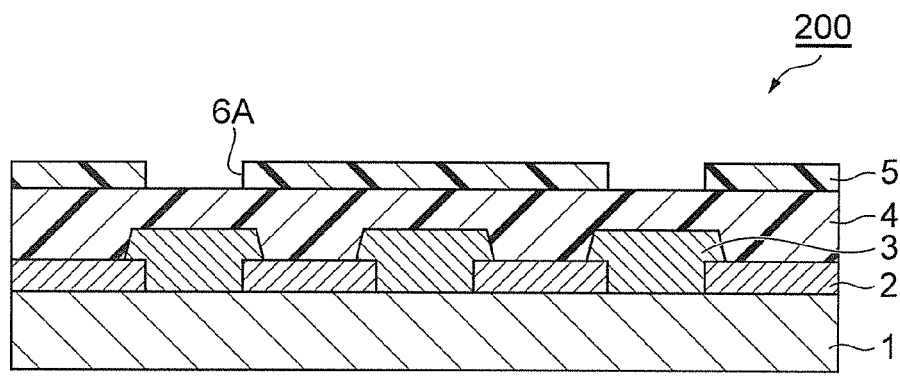
FIG. 2 is a schematic sectional view showing one embodiment of a step of producing a semiconductor apparatus.
Figure 3:
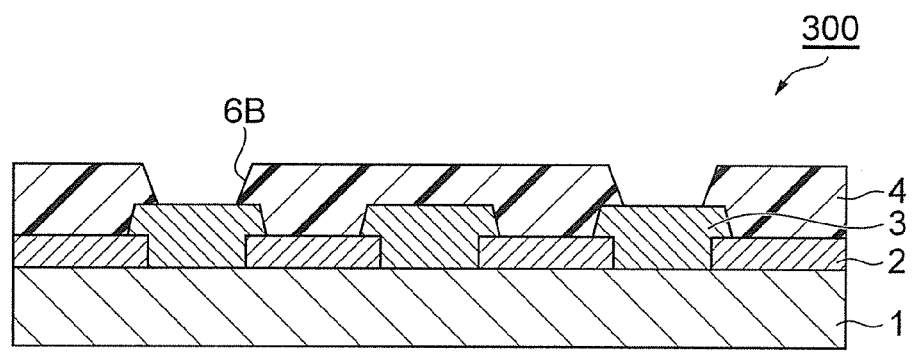
FIG. 3 is a schematic sectional view showing one embodiment of a step of producing a semiconductor apparatus.

Next, a photosensitive resin layer 5 having a window portion 6A is formed on the interlayer insulation film 4 to obtain a structure 200 shown in FIG. 2. The photosensitive resin layer 5 is formed by applying a photosensitive resin such as chlorinated rubber based photosensitive resins, phenol novolak based photosensitive resins, polyhydroxy styrene based photosensitive resins, and polyacrylic ester based photosensitive resins by a spin coat method, for example. The window portion 6A is formed using a known photolithography technique so that a predetermined portion of the interlayer insulation film 4 may be exposed.

The interlayer insulation film 4 is etched to form a window portion 6B. Subsequently, the photosensitive resin layer 5 is removed to obtain a structure 300 shown in FIG. 3. A dry etching means using a gas such as oxygen and carbon tetrafluoride can be used for etching of the interlayer insulation film 4. The portion of the interlayer insulation film 4 corresponding to the window portion 6A is selectively removed by this etching to obtain the interlayer insulation film 4 having the window portion 6B provided so that the first conductive layer 3 may be exposed. Next, the photosensitive resin layer 5 is removed using an etching solution that corrodes only the photosensitive resin layer 5 without corroding the first conductive layer 3 exposed from the window portion 6B.

Figure 4:
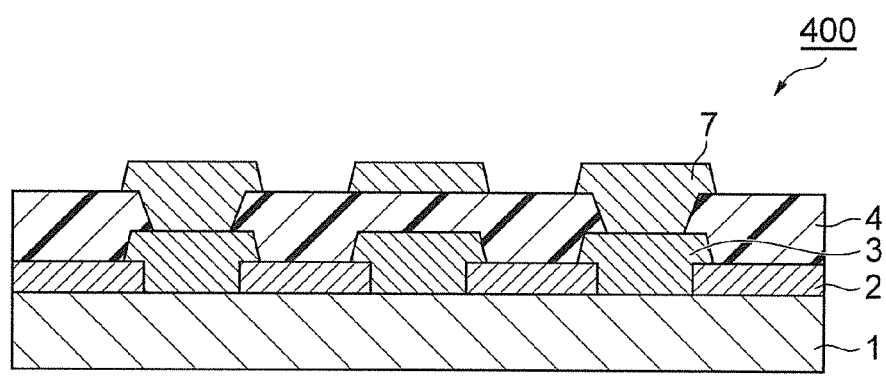
FIG. 4 is a schematic sectional view showing one embodiment of a step of producing a semiconductor apparatus.

Further, the second conductive layer 7 is formed in a portion corresponding to the window portion 6B to obtain a structure 400 shown in FIG. 4. A known photolithography technique can be used for formation of the second conductive layer 7. Thereby, the second conductive layer 7 is electrically connected to the first conductive layer 3.

Figure 5:
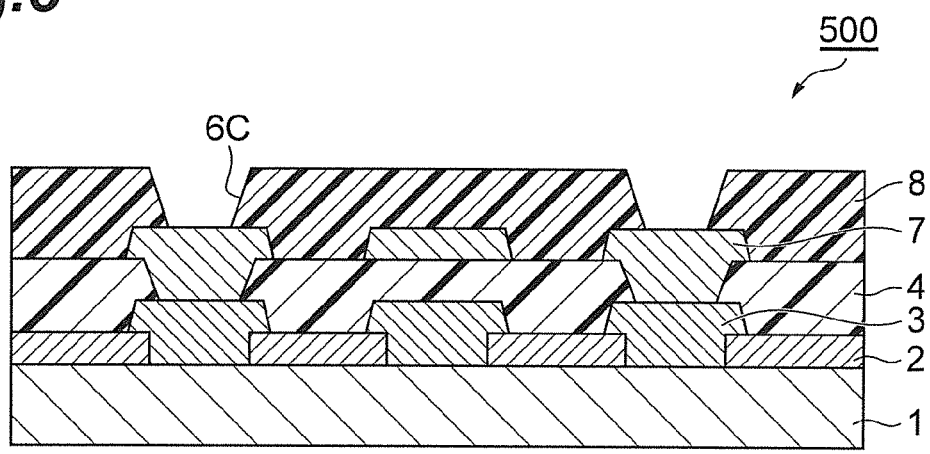
FIG. 5 is a schematic sectional view showing one embodiment of a step of producing a semiconductor apparatus.

Finally, a surface protective layer 8 is formed on the interlayer insulation film 4 and the second conductive layer 7 to obtain a semiconductor apparatus 500 shown in FIG. 5. In this embodiment, the surface protective layer 8 is formed as follows. First, the positive-type photosensitive resin composition according to First Embodiment is applied by a spin coat method onto the interlayer insulation film 4 and the second conductive layer 7, and dried to form a photosensitive resin film. Next, a predetermined portion is irradiated with light through a mask having a pattern corresponding to a window portion 6C. Subsequently, the predetermined portion is developed by an alkaline aqueous solution to pattern the photosensitive resin film. Subsequently, the photosensitive resin film is cured by heating to form a film as the surface protective layer 8. This surface protective layer 8 protects the first conductive layer 3 and the second conductive layer 7 from stress from an outside, α rays, and the like. The semiconductor apparatus 500 obtained has high reliability. The method of producing a resist pattern according to Second Embodiment is applied to the step of forming the surface protective layer 8, and duplicated description thereof will be omitted here.

While a method for production of a semiconductor apparatus having a two-layered wiring structure has been shown in the present embodiment, in formation of a multi-layered interconnection structure of not less than three layers, the above-mentioned steps can be repeated to form each layer. Namely, it is possible to form a multi-layered pattern by repeating each step of forming the interlayer insulation film 4, and each step of forming the surface protective layer 8. Moreover, the positive-type photosensitive resin composition according to First Embodiment and the method of producing a resist pattern according to Second Embodiment can be applied not only to formation of the surface protective layer 8 but also to formation of the interlayer insulation film 4.

(Fourth Embodiment: An Electronic Component)

The electronic component according to Fourth Embodiment of the present invention has the resist pattern formed by the method for production according to Second Embodiment as the interlayer insulation layer or the surface protective layer. Specifically, the above-mentioned resist pattern can be used as a surface protective layer and an interlayer insulation layer of a semiconductor apparatus, an interlayer insulation layer of a multi-layered interconnection board, and the like. The electronic component according to the present embodiment is not limited in particular except that the electronic component has the surface protective layer and the interlayer insulation layer formed using the positive-type photosensitive resin composition according to First Embodiment, and can have various structures.

Figure 6:
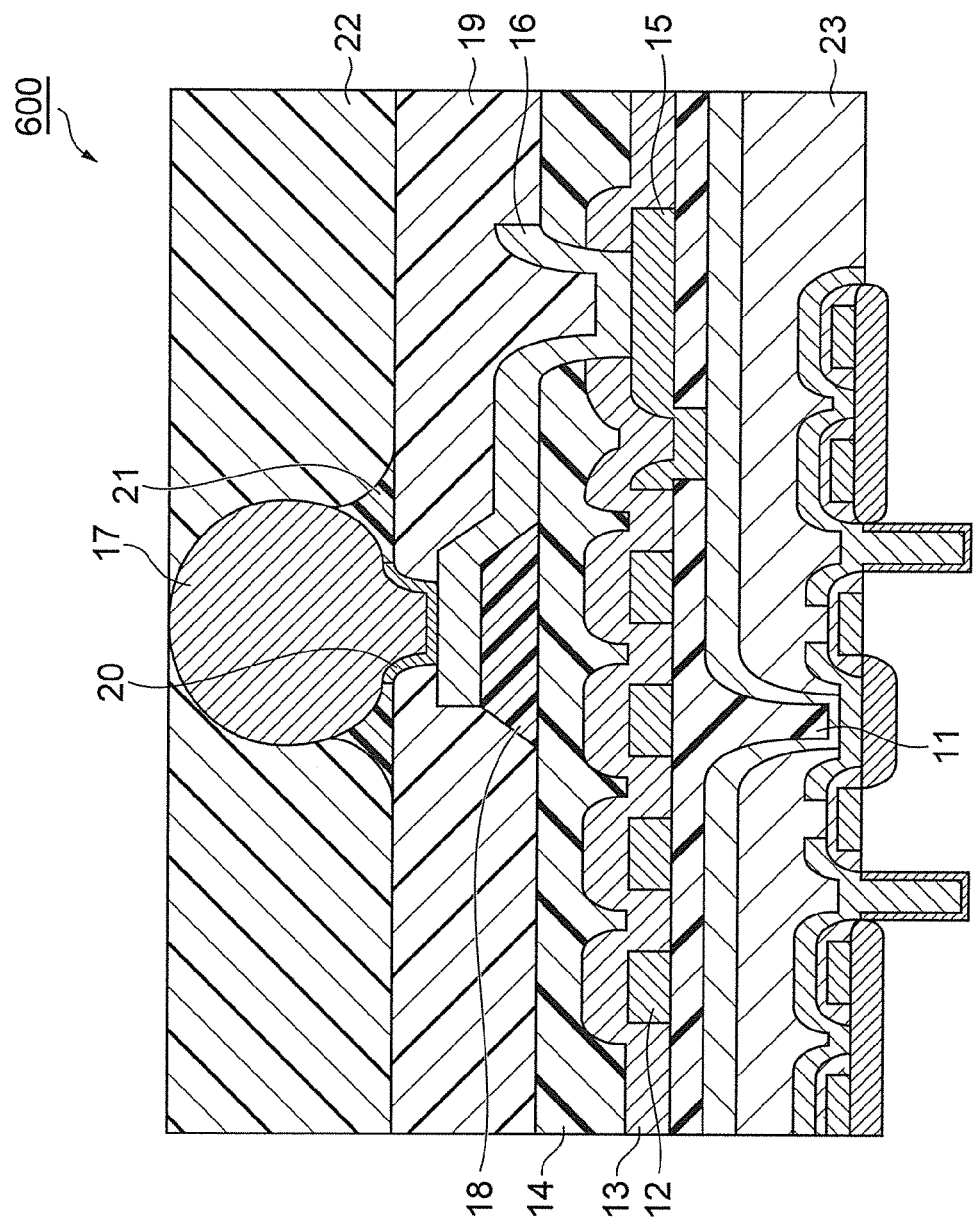
FIG. 6 is a schematic sectional view showing one embodiment of an electronic component (semiconductor apparatus)
Figure 7:
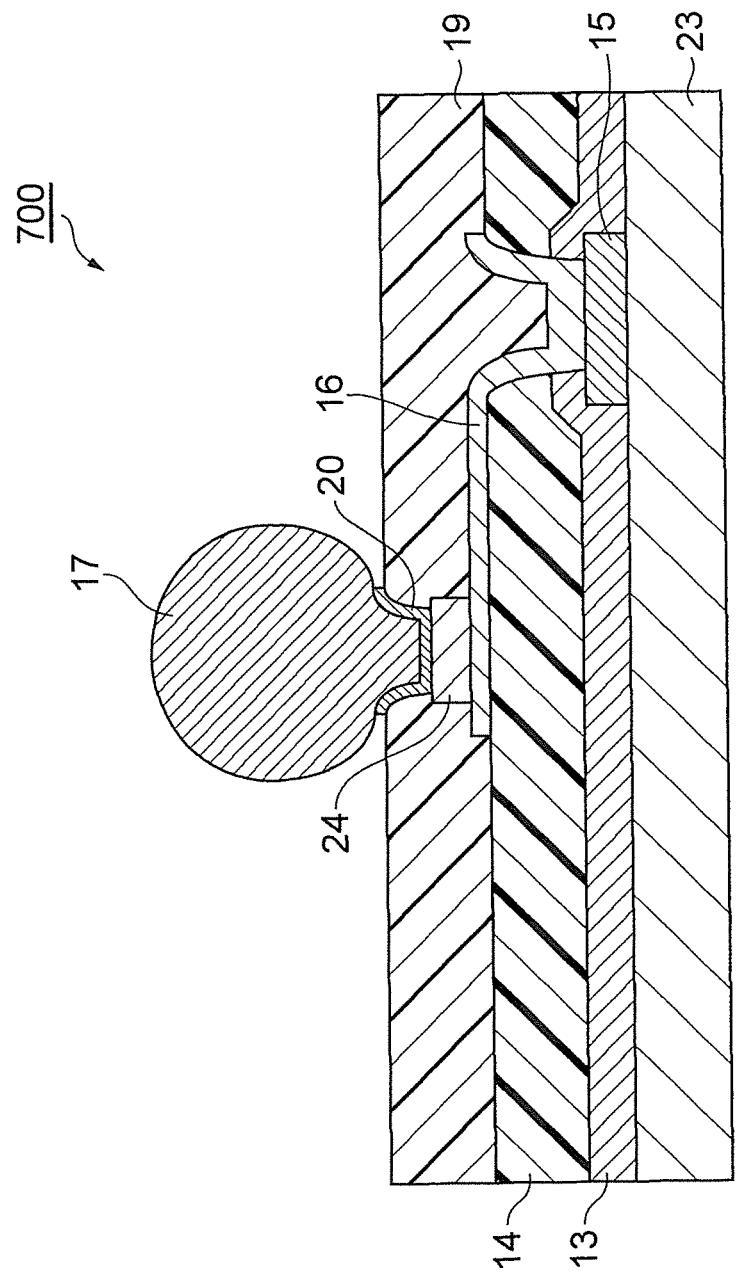
FIG. 7 is a schematic sectional view showing one embodiment of an electronic component (semiconductor apparatus).

Moreover, the positive-type photosensitive resin composition according to First Embodiment has excellent stress relief properties, adhesiveness, and the like, and can be used also as various structural materials in packages of recently developed various structures. FIG. 6 and FIG. 7 show a cross sectional structure of such a semiconductor apparatus as an example.

FIG. 6 is a schematic sectional view showing a wiring structure as one embodiment of the semiconductor apparatus. The semiconductor apparatus 600 shown in FIG. 6 includes a silicon chip 23; an interlayer insulation film 11 provided on one surface side of the silicon chip 23; an Al wiring layer 12 formed on the interlayer insulation film 11 and having a pattern including a pad portion 15; an insulating layer 13 (for example, P—SiN layer) and a surface protective layer 14 sequentially deposited on the interlayer insulation film 11 and the Al wiring layer 12 while an opening is formed on the pad portion 15; a core 18 having an island shape arranged on the surface protective layer 14 and in the vicinity of the opening; and a redistribution layer 16 that extends on the surface protective layer 14 so as to contact the pad portion 15 within the opening of the insulating layer 13 and the surface protective layer 14, and contact a surface of the surface protective layer 14 on a side opposite to the core 18. The semiconductor apparatus 600 further includes a cover coat layer 19 formed to cover the surface protective layer 14, the core 18, and the redistribution layer 16, and having an opening formed in a portion of the redistribution layer 16 on the core 18; a conductive ball 17 connected with the redistribution layer 16 through a barrier metal 20 in the opening of the cover coat layer 19; a collar 21 holding the conductive ball 17; and an underfill 22 provided on the cover coat layer 19 around the conductive ball 17. The conductive ball 17 is used as an external connection terminal, and is formed of solder, gold, and the like. The underfill 22 is provided in order to relieve stress when the semiconductor apparatus 600 is mounted.

FIG. 7 is a schematic sectional view showing a wiring structure as one embodiment of a semiconductor apparatus. In the semiconductor apparatus 700 of FIG. 7, an Al wiring layer (not shown) and a pad portion 15 of the Al wiring layer are formed on the silicon chip 23. An insulating layer 13 is formed on the upper portion of the Al wiring layer (not shown) and a pad portion 15 of the Al wiring layer, and a surface protective layer 14 of the element is further formed. A redistribution layer 16 is formed on the pad portion 15. This redistribution layer 16 extends to an upper portion of a connection portion 24 with a conductive ball 17. A cover coat layer 19 is formed on the surface protective layer 14. The redistribution layer 16 is connected to the conductive ball 17 through a barrier metal 20.

In the semiconductor apparatuses of FIG. 6 and FIG. 7, the positive-type photosensitive resin composition according to First Embodiment can be used as a material for forming not only the layer insulation film 11 and the surface protective layer 14 but also the cover coat layer 19, the core 18, the collar 21, and the underfill 22. A cured body using the positive-type photosensitive resin composition according to First Embodiment has excellent adhesiveness to the Al wiring layer 12, a metal layer of the redistribution layer 16 (for example, Cu, Au, Ni, Ti and the like), an encapsulant, and the like, and a high stress relief effect. Accordingly, a semiconductor apparatus in which this cured body is used for the surface protective layer 14, the cover coat layer 19, the core 18, the collar 21 such as solder, the underfill 22 used in a flip chip, and the like, has very high reliability.

The positive-type photosensitive resin composition according to First Embodiment is particularly suitably used for the surface protective layer 14 and/or the cover coat layer 19 of the semiconductor apparatus having the redistribution layer 16 in FIG. 6 and FIG. 7.

A thickness of the surface protective layer or that of the cover coat layer is preferably 3 to 20 µm, and more preferably 5 to 15 µm.

As mentioned above, use of the positive-type photosensitive resin composition according to First Embodiment allows curing by heating at a low temperature of not more than 250° C. in the above-mentioned heat-treating step, in which a temperature of not less than 300° C. was conventionally needed. In the heat-treating step, a heating temperature is preferably not more than 200° C., and more preferably 140° C. to 200° C. The positive-type photosensitive resin composition according to First Embodiment can also prevent reduction in dimensional accuracy because of small volume shrinkage (cure shrinkage) of a photosensitive polyimide and the like at the heat-treating step. A cured film of the positive-type photosensitive resin composition has a high glass transition temperature. Accordingly, the cured film provides a surface protective layer or a cover coat layer having excellent thermal resistance. As a result, an electronic component such as a semiconductor apparatus having high reliability can be obtained with a high yield.

While the suitable embodiments according to the present invention have been described as mentioned above, the present invention will not be limited to those.

EXAMPLES

The present invention will be described in detail with reference to Examples below. However, the present invention will not be limited to these.

<Preparation of Positive-type Photosensitive Resin composition>

A1 and A2 were prepared as an alkali-soluble resin having a phenolic hydroxyl group which is the (A) component.

A1: cresol novolak resin (cresol/formaldehyde novolak resins, m-cresol/p-cresol(molar ratio)=60/40, weight average molecular weight in terms of polystyrene=13000, made by Asahi Organic Chemicals Industry Co., Ltd., trade name "EP4020G") was prepared.

Synthesis Example 1

Synthesis of Modified Phenol Resin (A2) Having Phenolic Hydroxyl Group Modified with a Compound Having an Unsaturated Hydrocarbon Group Having 4 to 100 Carbon Atoms 100 parts by mass of phenol, 43 parts by mass of linseed oil, and 0.1 parts by mass of trifluoromethanesulfonic acid were mixed, and stirred at 120° C. for 2 hours to obtain a vegetable oil-modified phenol derivative (a). Next, 130 g of the vegetable oil-modified phenol derivative (a), 16.3 g of para-formaldehyde, and 1.0 g of oxalic acid were mixed, and stirred at 90° C. for 3 hours. Next, after the temperature was raised to 120° C. and stirring was performed under reduced pressure for 3 hours, 29 g of succinic anhydride and 0.3 g of triethylamine were added to the reaction solution, and stirred under atmospheric pressure at 100° C. for 1 hour. The reaction solution was cooled to room temperature (25° C.) to obtain a reaction product, i.e., a phenol resin modified with a compound having an unsaturated hydrocarbon group having 4 to 100 carbon atoms (hereinafter, referred to as "A2") (acid value of 120 mgKOH/g). The weight average molecular weight of A2 determined by standard polystyrene conversion of a GPC method was approximately 25,000.

As the (B) component, a compound C that produces an acid by light (o-quinone diazide compound) was prepared.

B 1:1-naphthoquinone-2-diazido-5-sulfonic acid ester of 1,1-bis(4-hydroxyphenyl)-1-[4-{1-(4-hydroxyphenyl)-1-methylethyl}phenyl]ethane (esterification rate of approximately 90%, made by AZ Electronic Materials S.A., trade name "TPPA528")

As the (C) component, thermal crosslinking agents C 1 to C3 were prepared.

C1: hexakis(methoxymethyl)melamine (made by SANWA Chemical Co., Ltd., trade name "NIKALAC MW-30HM") was prepared.

C2: 1,1-bis{3,5-bis(methoxymethyl)-4-hydroxyphenyl}methane (made by Honshu Chemical Industry Co., Ltd., trade name "TMOM-pp-BPF")

C3: N,N',N'',N'''-tetrakis(methoxymethyl)glycoluril (made by SANWA Chemical Co., Ltd., trade name "NIKALAC MX-270")

As the (D) component, silane compounds D1 to D6 were prepared.

D1: 3-glycidoxypropyltrimethoxysilane (made by Shin-Etsu Chemical Co., Ltd., trade name "KBM-403")

D2: 3-glycidoxypropyltriethoxysilane (made by Shin-Etsu Chemical Co., Ltd., trade name "KBE-403")

D3:3-glycidoxypropyldimethoxysilane (made by Shin-Etsu Chemical Co., Ltd., trade name "KBM-402")

D4: 3-glycidoxypropyldiethoxysilane (made by Shin-Etsu Chemical Co., Ltd., trade name "KBE-402")

D5: bis(3-(triethoxysilyl)propyl)disulfide (made by Dow Corning Toray Co., Ltd., trade name "CF 4289")

D6: bis(3-(triethoxysilyl)propyl)tetrasulfide (made by Shin-Etsu Chemical Co., Ltd., trade name "KBE-846")

D7: ureidopropyltriethoxysilane (made by Dow Corning Toray Co., Ltd., trade name "AY-43-031")
D8: (3-mercaptopropyl)trimethoxysilane (reagent made by Tokyo Chemical Industry Co., Ltd.)

As the (E) component, acrylic resins E1 and E2 were prepared.

Synthesis Example 2

Synthesis of Acrylic Resin E1

75 g of toluene and 75 g of isopropanol (IPA) were weighed and placed in a 500 ml three-necked flask including a stirrer, a nitrogen introducing pipe, and a thermometer, and polymerizable monomers of 85 g of butyl acrylate (BA), 24 g of lauryl acrylate (DDA), 14 g of acrylic acid (AA), 7.9 g of 1,2,2,6,6-pentamethylpiperidin-4-ylmethacrylate (trade name: FA-711 MM, made by Hitachi Chemical Co., Ltd.), and 0.13 g of azobisisobutyronitrile (AIBN) separately weighed were added. While stirring was performed at room temperature at the number of rotation of stirring of approximately 270 rpm, nitrogen gas was flowed at a flow rate of 400 ml/min for 30 minutes to remove dissolved oxygen. Then, flow of nitrogen gas was stopped, the flask was sealed, and the temperature was raised using a constant temperature water bath to 65° C. in approximately 25 minutes. The temperature was kept for 14 hours, and the polymerization reaction was performed to obtain acrylic resin E1. The polymerization rate at this time was 98%. Moreover, the weight average molecular weight ($M_w$) of E1 determined by standard polystyrene conversion of a GPC method is shown in Table 1.

Synthesis Example 3

Synthesis of Acrylic Resin E2

Acrylic resin E2 was synthesized in the same manner as in Synthesis Example 2 except that a polymerizable monomer shown in Table 1 was used. The weight average molecular weight of acrylic resin E2 synthesized is shown in Table 1.

TABLE 1

| Polymerizable monomer | E1 | E2 |
|---|---|---|
| FA-711MM | 7.9 g (35 mmol) | 0.56 g (2.5 mmol) |
| FA-712HM | — | 0.74 g (3.5 mmol) |
| BA | 85 g (670 mmol) | 86 g (680 mmol) |
| DDA | 24 g (100 mmol) | — |
| AA | 14 g (200 mmol) | 14 g (200 mmol) |
| X-22-2475 | — | 15 g (36 mmol) |
| Weight average molecular weight | 36,000 | 20,000 |

FA-711MM: 1,2,2,6,6-pentamethylpiperidin-4-yl methacrylate (made by Hitachi Chemical Co., Ltd.)
FA-712HM: 2,2,6,6-tetramethylpiperidin-4-yl methacrylate (made by Hitachi Chemical Co., Ltd.)
BA: n-butyl acrylate
DDA: lauryl acrylate (dodecyl acrylate ester)
AA: acrylic acid
X-22-2475: methacryl-modified silicone oil (functional group equivalent: 420 g/mol, made by Shin-Etsu Chemical Co., Ltd.)

As the (F) component, F1: trimethylsulfonium methyl sulfate (made by Fluorochem Ltd.) was prepared.
As the (H) solvent component, Hi: ethyl lactate was prepared.

Examples 1 to 8

The (A) to (F) components and the (H) component were blended in a predetermined proportion shown in Table 2. The solution was pressurized and filtered using a Teflon (R) filter with a pore of 3 μm to prepare solutions of the positive-type photosensitive resin compositions in Examples 1 to 8.

Comparative Examples 1 and 2

Without using the silane compound (D1) containing an epoxy group or the silane compound (D2) having a sulfide group as the (D) component, the (A) to (F) components and the (H) component were blended in a predetermined proportion shown in Table 2. The solution was pressurized and filtered using a Teflon (R) filter with a pore of 3 μm to prepare solutions of the positive-type photosensitive resin compositions in Comparative Examples 1 and 2. In the table, numeric values within brackets indicate parts by mass.

TABLE 2

| | | Example | | | | | | | | Comparative Example | |
|---|---|---|---|---|---|---|---|---|---|---|---|
| Component | | 1 | 2 | 3 | 4 | 5 | 6 | 7 | 8 | 1 | 2 |
| (A) | A1 | 80 | 80 | 80 | 80 | 80 | 80 | 80 | 80 | 80 | 80 |
| | A2 | 20 | 20 | 20 | 20 | 20 | 20 | 20 | 20 | 20 | 20 |
| (B) | B1 | 10 | 10 | 10 | 10 | 10 | 10 | 10 | 10 | 10 | 10 |
| (C) | C1 | 10 | 10 | 10 | 10 | 10 | — | — | — | 10 | 10 |
| | C2 | — | — | — | — | — | 10 | 10 | — | — | — |
| | C3 | — | — | — | — | — | — | — | 10 | — | — |
| (D) | D1 | 3 | — | — | — | — | — | — | — | — | — |
| | D2 | — | 3 | — | — | — | — | — | — | — | — |
| | D3 | — | — | 3 | — | — | — | 3 | 3 | — | — |
| | D4 | — | — | — | 3 | — | — | — | — | — | — |
| | D5 | — | — | — | — | 3 | — | — | — | — | — |
| | D6 | — | — | — | — | — | 3 | — | — | — | — |
| | D7 | — | — | — | — | — | — | — | — | 3 | — |
| | D8 | — | — | — | — | — | — | — | — | — | 3 |
| (E) | E1 | 10 | 10 | — | — | — | — | — | — | 10 | 10 |
| | E2 | — | — | 10 | 10 | 10 | 10 | 10 | 10 | — | — |
| (F) | F1 | 1 | 1 | 1 | 1 | 1 | 1 | 1 | 1 | 1 | 1 |
| (H) | H1 | 160 | 160 | 160 | 160 | 160 | 160 | 160 | 160 | 160 | 160 |

<Evaluation of Photosensitive Resin Composition>
(Adhesion Test): Stud Pull-off Test Each of the positive-type photosensitive resin compositions obtained in Examples 1 to 8 and Comparative Examples 1 and 2 was applied onto various substrates by spin coating, and heated at 120° C. for 3 minutes to form a coating film having a film thickness of approximately 12 to 14 µm. Using a vertical diffusion furnace (KOYO THERMO SYSTEMS CO., LTD., trade name "µ-TF"), a rectangular pattern of the coating film was subjected to a heat treatment (curing) in nitrogen at a temperature of 175° C. (temperature rise time of 1.5 hours) for 2 hours to obtain a cured film having a film thickness of approximately 10 µm. The cured film together with the substrate was cut into small pieces, and an aluminum stud and the cured film were joined via an epoxy resin layer. Next, the stud was pulled, and a load in peel off was measured (Romulus made by PHOTOTECHNICA CORPORATION). The load in peel off was evaluated as follows. The result is shown in Table 3.

A: 500 (kgf/cm$^2$) or more
B: 300-500 (kgf/cm$^2$)
C: 100-300 (kgf/cm$^2$)
D: 100 (kgfcm$^2$) or less Substrate for evaluation in adhesion test
Ti substrate: substrate in which Ti was formed by sputtering on a silicon substrate (8 inches).
Au substrate: substrate in which TiN was formed by sputtering on a silicon substrate (8 inches) and Au was further formed by sputtering on TiN.
Cu substrate: substrate in which TiN was formed by sputtering on a silicon substrate (8 inches) and copper was further formed by sputtering on TiN (Photosensitive Properties)

The positive-type photosensitive resin composition obtained in Examples 1 to 8 and Comparative Examples 1 and 2 were applied onto a silicon substrate (8 inches) by spin coating, and heated for 3 minutes at 120° C. to form a coating having a thickness of 12 to 14 µm. Next, reduced projection exposure by an i line (365 nm) was performed through a mask using an i line stepper (made by Canon Inc., trade name "FPA-3000i"). After exposure, development was performed by a 2.38% by mass of aqueous solution of tetramethylammonium hydroxide (TMAH), and development was performed so that a residual thickness of the film might be approximately 80 to 95% of an initial thickness thereof. Subsequently, the substrate was rinsed by water, and the minimum exposure amount necessary for pattern formation and a size of the minimum square hole pattern opened were determined. For each photosensitive resin composition, the minimum exposure amount was evaluated as sensitivity and the size of the minimum square hole pattern opened was evaluated as resolution.

(Physical Properties of a Cured Film: Elongation at Break and Elastic Modulus)

The positive-type photosensitive resin composition obtained in Examples 1 to 8 and Comparative Examples 1 and 2 were applied onto a silicon substrate by spin coating, and heated at 120° C. for 3 minutes to form a coating having a thickness of approximately 12 to 14 µm. Subsequently, the coatings were exposed at a full wave length through a mask using a proximity exposure machine (made by Canon Inc., trade name "PLA-600FA"). After exposure, development was performed by using a 2.38% aqueous solution of TMAH to obtain a rectangular pattern having a width of 10 mm. Then, using a vertical diffusion furnace (KOYO THERMO SYSTEMS CO., LTD., trade name "µ-TF"), the rectangular pattern was subjected to a heat treatment (curing) in nitrogen at a temperature of 175° C. (temperature rise time of 1.5 hours) for 2 hours to obtain a cured film having a film thickness of approximately 10 µm. The cured film having a film thickness of approximately 10 µm obtained by the method was peeled off from the silicon substrate, and the elongation at break (EL) and elastic modulus (YM) of the peeled film were measured using an "Autograph AGS-H100 N" made by SHIMADZU Corporation. The width of the sample was 10 mm, the film thickness was 9 to 11 µm, and an interval between chucks was 20 mm. The tensile rate was 5 mm/min, and the measurement temperature was approximately room temperature (20° C. to 25° C.). The averages of the measured values of not less than 5 test pieces obtained from the cured film obtained on the same condition each were defined as the "elongation at break (EL)" and the "elastic modulus (YM)." The measured EL and YM are shown in Table 3.

TABLE 3

| Items | | 1 | 2 | 3 | 4 | 5 | 6 | 7 | 8 | Comparative Example 1 | Comparative Example 2 |
|---|---|---|---|---|---|---|---|---|---|---|---|
| Adhesiveness test | Au | A | A | A | A | A | A | A | A | D | D |
| | Cu | A | A | A | A | A | A | A | A | C | C |
| | Ti | A | A | A | A | B | B | B | B | C | C |
| | Si | A | A | A | A | A | A | A | A | B | B |
| Sensitivity | | 400 | 400 | 400 | 420 | 400 | 410 | 400 | 400 | 500 | 500 |
| Resolution | | 30 | 30 | 30 | 30 | 30 | 30 | 30 | 30 | 40 | 40 |
| Elongation at break (EL) | | 15 | 22 | 23 | 20 | 17 | 25 | 25 | 23 | 24 | 25 |
| Elastic modulus (YM) | | 2.8 | 2.4 | 2.4 | 2.4 | 2.8 | 2.4 | 2.4 | 2.5 | 2.4 | 2.4 |

As is apparent from Table 3, it is understood that the positive-type photosensitive resin compositions in Examples 1 to 8 demonstrate high sensitivity and resolution, and adhesiveness to various metal substrates is improved. Moreover, it is found that the positive-type photosensitive resin compositions in Examples 1 to 8 have the same film physical properties as those formed of the material to which the silane compound (D1) containing an epoxy group or the silane compound (D2) containing a sulfide group is not added, even if the silane compound (D 1) containing an epoxy group or the silane compound (D2) containing a sulfide group is added.

INDUSTRIAL APPLICABILITY

The positive-type photosensitive resin composition according to the present invention can be used for formation of the surface protective layer and interlayer insulation film for semiconductor elements mounted on electronic devices, and the redistribution layer for the semiconductor package.

REFERENCE SIGNS LIST

1 . . . semiconductor substrate, 2 . . . protective film, 3 . . . first conductive layer, 4 . . . interlayer insulation film, 5 . . . photosensitive resin layer, 6A, 6B, 6C . . . window portion, 7 . . . second conductive layer, 8 . . . surface protective layer, 11 . . . interlayer insulation film, 12 . . . Al wiring layer, 13 . . . insulating layer, 14 . . . surface protective film, 15 . . . pad portion, 16 . . . redistribution layer, 17 . . . conductive ball, 18 . . . island core, 19 . . . cover coat layer, 20 . . . barrier metal, 21 . . . collar, 22 . . . underfill, 23 . . . silicon chip, 24 . . . connection portion, 100, 200, 300, 400 . . . structure, 500, 600, 700 . . . semiconductor apparatus

The invention claimed is:

1. A positive-type photosensitive resin composition, comprising:
    an alkali-soluble resin having a phenolic hydroxyl group,
    a compound that produces an acid by light,
    a thermal crosslinking agent, and
    a silane compound having at least one functional group selected from an epoxy group and a sulfide group.

2. The positive-type photosensitive resin composition according to claim 1, wherein as the silane compound, the positive-type photosensitive resin composition contains a compound having a structure represented by the following formula (1):

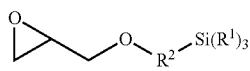

wherein $R^1$ represents a monovalent organic group, and $R^2$ group represents a divalent organic group.

3. The positive-type photosensitive resin composition according to claim 1, wherein as the silane compound, the positive-type photosensitive resin composition contains a compound having a structure represented by the following formula (2):

wherein $R^3$ and $R^4$ each independently represent a divalent organic group, $R^5$ and $R^6$ each independently represent a monovalent organic group, and n represents an integer of 1 to 6.

4. The positive-type photosensitive resin composition according to claim 1, wherein as the alkali-soluble resin, the positive-type photosensitive resin composition contains a phenol resin.

5. The positive-type photosensitive resin composition according to claim 1, wherein as the alkali-soluble resin, the positive-type photosensitive resin composition contains a first phenol resin that is a phenol resin having no phenolic hydroxyl group modified with an unsaturated hydrocarbon group-containing compound, and a second phenol resin that is a modified phenol resin having a phenolic hydroxyl group modified with an unsaturated hydrocarbon group-containing compound.

6. The positive-type photosensitive resin composition according to claim 5, wherein the second phenol resin further has a phenolic hydroxyl group modified with a polybasic acid anhydride.

7. The positive-type photosensitive resin composition according to claim 5, wherein a content of the first phenol resin is 5 to 95% by mass based on a total of the content of the first phenol resin and a content of the second phenol resin.

8. The positive-type photosensitive resin composition according to claim 1, wherein the compound that produces an acid by light is an o-quinone diazide compound.

9. The positive-type photosensitive resin composition according to claim 1, wherein a content of the compound that produces an acid by light is 3 to 100 parts by mass based on 100 parts by mass of a content of the alkali-soluble resin.

10. The positive-type photosensitive resin composition according to claim 1, further comprising an acrylic resin.

11. The positive-type photosensitive resin composition according to claim 10, further comprising a compound that produces an acid by heat.

12. The positive-type photosensitive resin composition according to claim 11, further comprising an elastomer.

13. The positive-type photosensitive resin composition according to claim 10, further comprising an elastomer.

14. The positive-type photosensitive resin composition according to claim 1, further comprising a compound that produces an acid by heat.

15. The positive-type photosensitive resin composition according to claim 1, further comprising an elastomer.

16. A method of producing a resist pattern, comprising:
    a first step of applying the positive-type photosensitive resin composition according to claim 1 onto a support substrate, and drying the applied positive-type photosensitive resin composition to form a photosensitive resin film,
    a second step of exposing the photosensitive resin film,
    a third step of developing the photosensitive resin film after exposure with an alkali aqueous solution to form a resist pattern, and
    a fourth step of heating the resist pattern.

17. The method of producing a resist pattern according to claim 16, wherein the fourth step is a step of heating the resist pattern at a temperature of not more than 200° C.

18. An electronic component having a resist pattern created by the method of producing a resist pattern according to claim 16 as an interlayer insulating layer or a surface protective film.

19. An electronic component having a resist pattern created by the method of producing a resist pattern according to claim 16 as a cover coat layer.

20. An electronic component having a resist pattern created by the method of producing a resist pattern according to claim 16 as a core for redistribution.

21. An electronic component having a resist pattern created by the method of producing a resist pattern according to claim 16 as a collar for holding a conductive ball, which is an external connection terminal.

22. An electronic component having a resist pattern created by the method of producing a resist pattern according to claim 16 as an underfill.

* * * * *